(12) United States Patent
Ikemasu et al.

(10) Patent No.: US 6,818,993 B2
(45) Date of Patent: Nov. 16, 2004

(54) INSULATION STRUCTURE FOR WIRING WHICH IS SUITABLE FOR SELF-ALIGNED CONTACT AND MULTILEVEL WIRING

(75) Inventors: Shinichiroh Ikemasu, Kawasaki (JP); Narumi Okawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/920,927

(22) Filed: Aug. 3, 2001

(65) Prior Publication Data

US 2002/0027259 A1 Mar. 7, 2002

Related U.S. Application Data

(62) Division of application No. 08/876,908, filed on Jun. 16, 1997, now Pat. No. 6,344,692.

(30) Foreign Application Priority Data

Jul. 18, 1996 (JP) ............................................. 8-189424

(51) Int. Cl.[7] ........................ H01L 23/48; H01L 23/52; H01L 29/40; H01L 27/108; H01L 29/76
(52) U.S. Cl. ....................................... 257/758; 257/306
(58) Field of Search ................................. 257/306, 758

(56) References Cited

U.S. PATENT DOCUMENTS

| | | | |
|---|---|---|---|
| 5,036,370 A | | 7/1991 | Miyago et al. |
| 5,061,985 A | | 10/1991 | Meguro et al. |
| 5,150,276 A | | 9/1992 | Gonzalez et al. |
| 5,196,910 A | | 3/1993 | Moriuchi et al. |
| 5,302,551 A | | 4/1994 | Iranmanesh et al. |
| 5,346,844 A | | 9/1994 | Cho et al. |
| 5,364,813 A | * | 11/1994 | Koh ............................ 438/397 |
| 5,500,558 A | * | 3/1996 | Hayashide ................... 257/758 |
| 5,573,965 A | | 11/1996 | Chen et al. |
| 5,612,254 A | | 3/1997 | Mu et al. |
| 5,661,344 A | | 8/1997 | Havemann et al. |
| 5,731,130 A | * | 3/1998 | Tseng ......................... 430/316 |
| 5,732,009 A | | 3/1998 | Tadaki et al. |
| 5,874,756 A | | 2/1999 | Ema et al. |

FOREIGN PATENT DOCUMENTS

| | | |
|---|---|---|
| JP | 58-115859 | 7/1983 |
| JP | 3-155663 | 7/1991 |
| JP | 3-167874 | 7/1991 |
| JP | 5-218332 | 8/1993 |
| JP | 6-97190 | 4/1994 |
| JP | 61-176148 | 8/1996 |
| JP | 9-36325 | 2/1997 |

OTHER PUBLICATIONS

Lee, K.P., et al., "A Process Technology for 1 Giga–Bit DRAM", Dec. 10–13, 1995, IEDM 95, pp. 907–910.*
Tomihisa Mizuno et al.; IEEE Transactions on Electron Devices, vol. 38, No. 3 pp. 584–591; Mar. 1991.

* cited by examiner

Primary Examiner—Long Pham
Assistant Examiner—Howard Weiss
(74) Attorney, Agent, or Firm—Westerman, Hattori, Daniels & Adrian, LLP

(57) ABSTRACT

A semiconductor device and its manufacture method wherein the semiconductor substrate has first and second insulating films, the first insulating film being an insulating film other than a silicon nitride film formed at least on a side wall of a conductive pattern including at least one layer of metal or metal silicide, and the second insulating film being a silicon nitride film formed to cover the first insulating film and the upper surface and side wall of the conductive pattern. The first insulating film may be formed to cover the upper surface and side wall of the conductive pattern. A semiconductor device and its manufacture method are provided which can realize high integrated DRAMs of 256 M or larger without degrading reliability and stability.

34 Claims, 37 Drawing Sheets

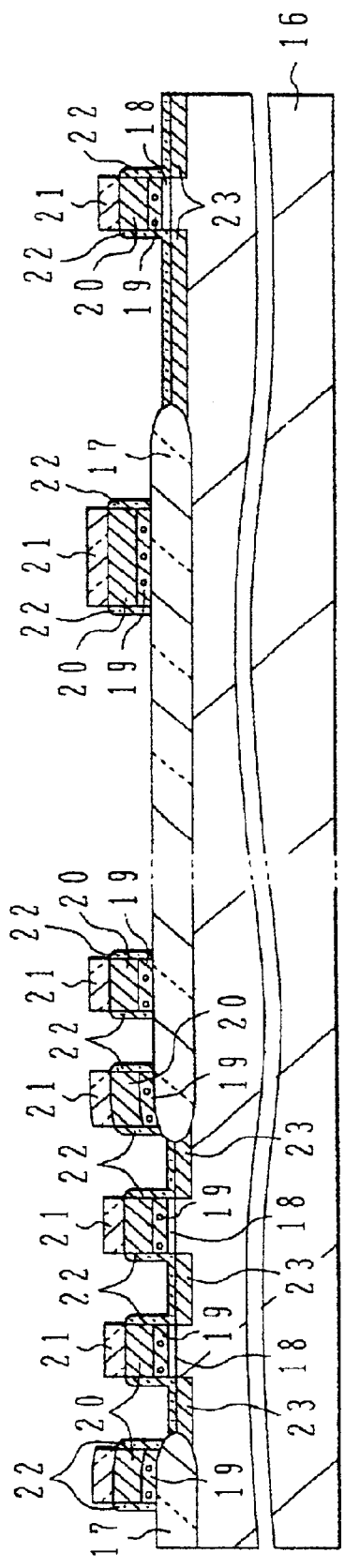
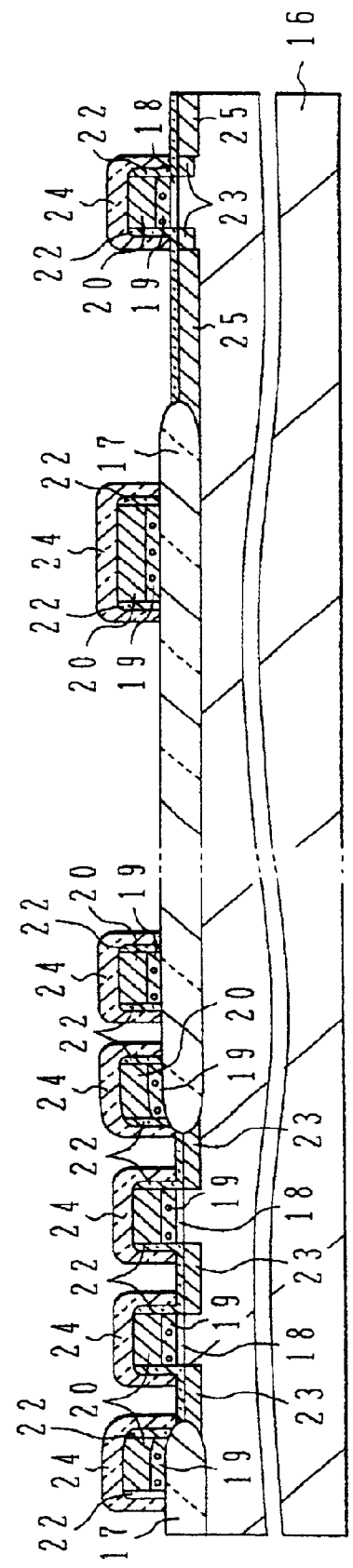
FIG.4A
FIG.4B

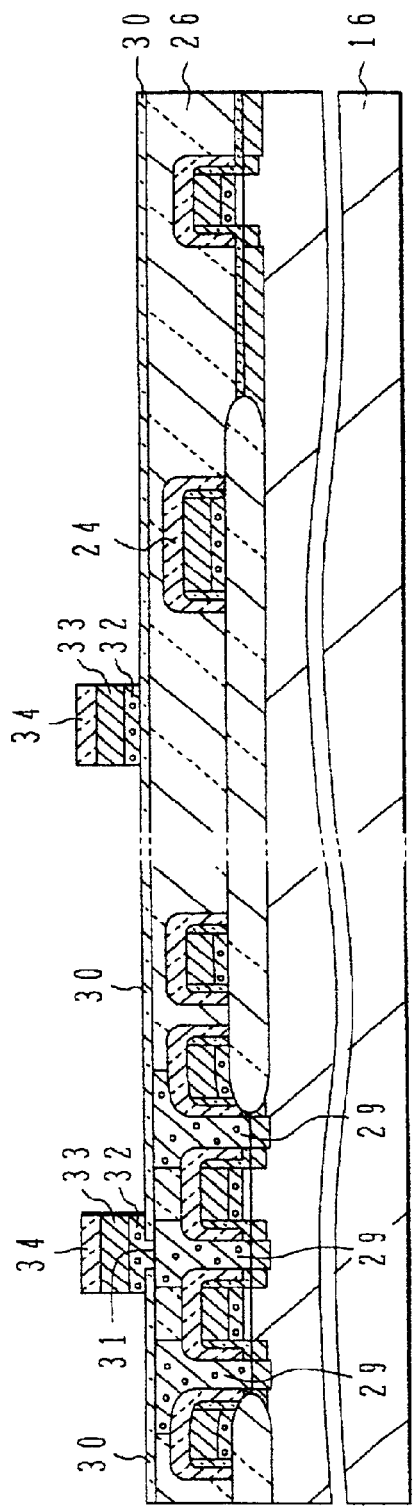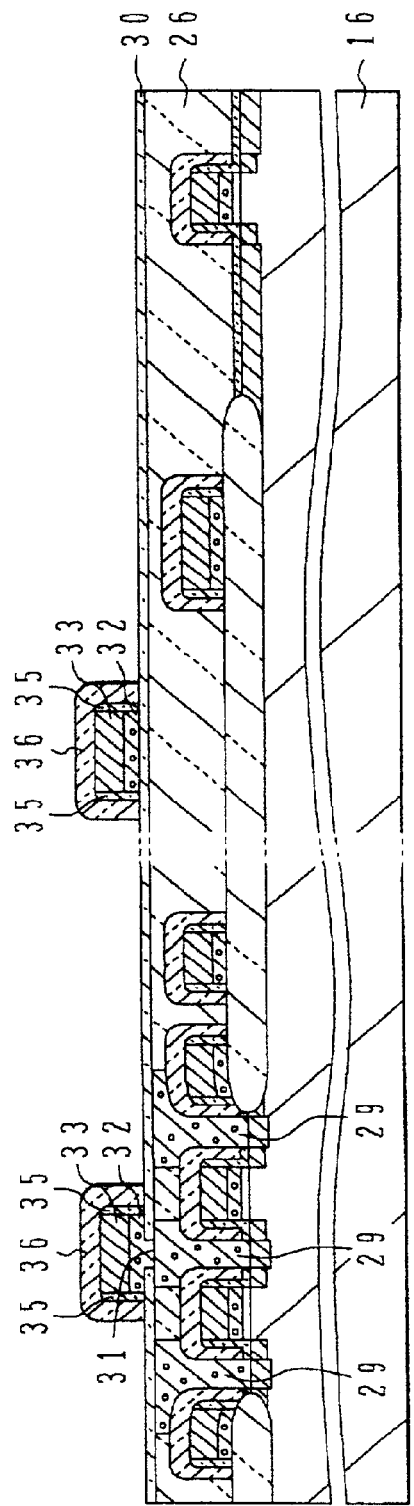

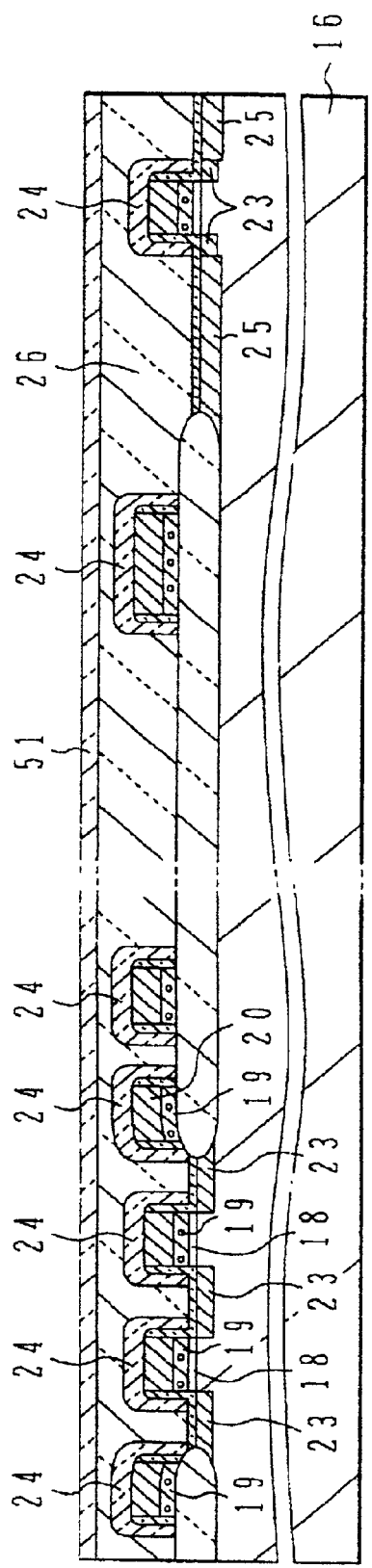
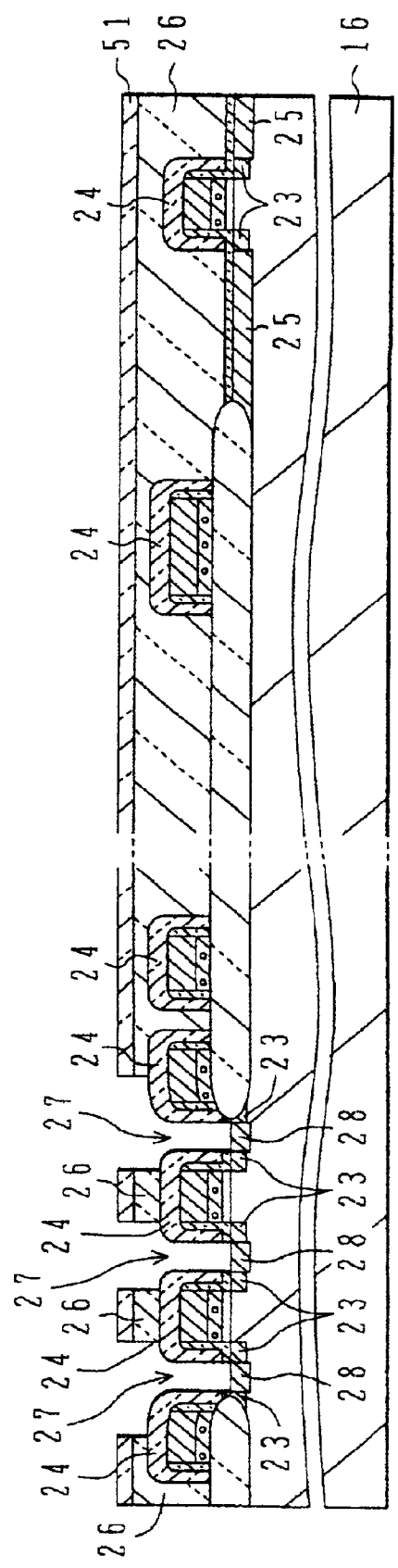
FIG.17A
FIG.17B

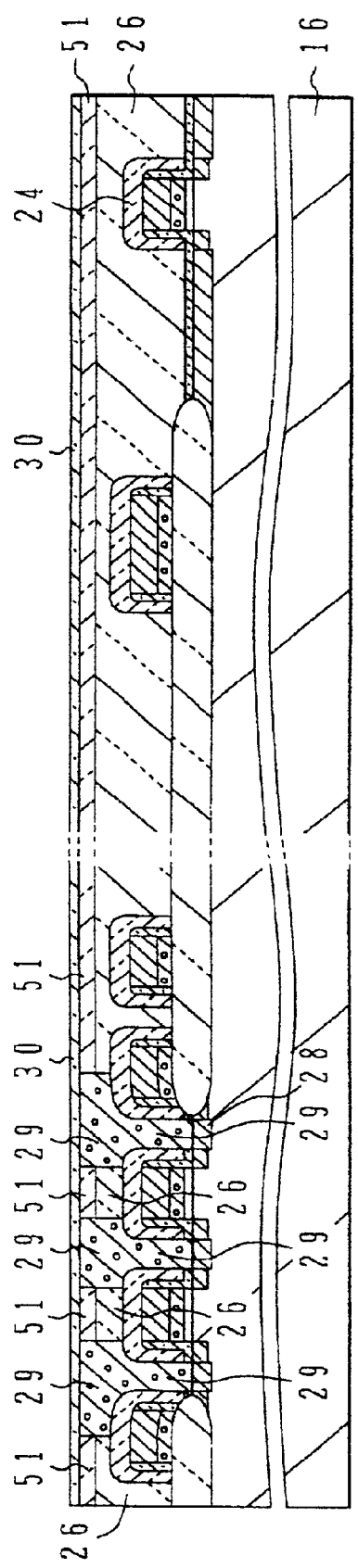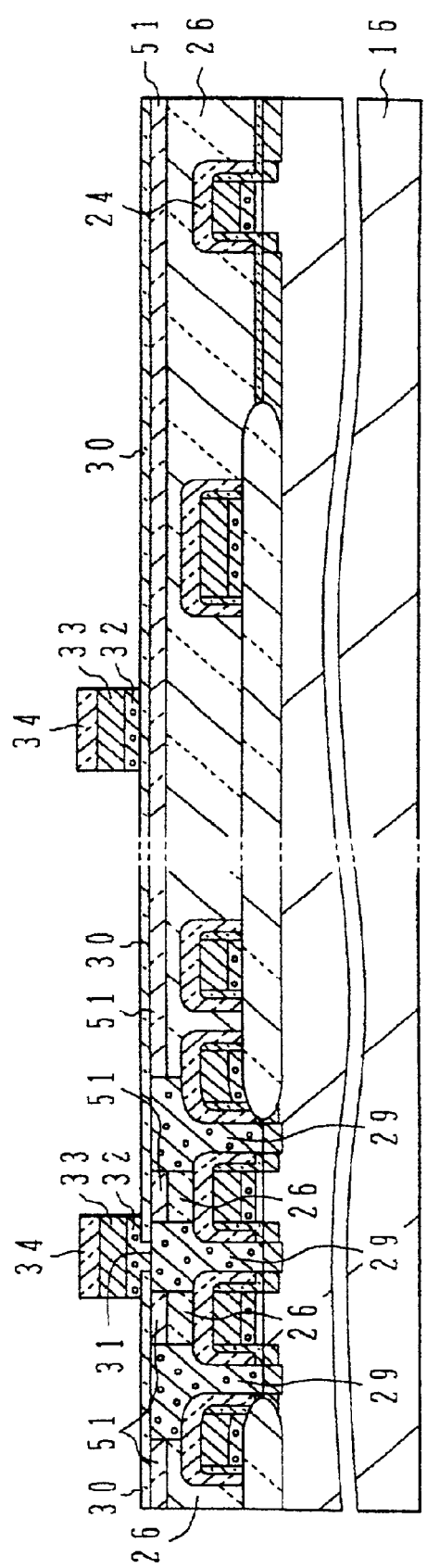

INSULATION STRUCTURE FOR WIRING WHICH IS SUITABLE FOR SELF-ALIGNED CONTACT AND MULTILEVEL WIRING

This application is a division of prior application Ser. No. 08/876,908 filed Jun. 16, 1997 now U.S. Pat. No. 6,344,692.

BACKGROUND OF THE INVENTION a) Field of the Invention

The present invention relates to a semiconductor device and its manufacture, and more particularly to a semiconductor device and its manufacture suitable for highly integrated and reliable DRAMs (Dynamic Random Access Memories).

b) Description of the Related Art

As the capacity of DRAM becomes large, it becomes essential to make its fundamental constituent, a memory cell, more finer in order to realize high integration and low cost.

A general DRAM cell is constituted of one MOS transistor and one capacitor. In order to make a memory cell finer, it is therefore substantial that how a large capacitance is obtained from a small cell size.

As a method of procuring a capacitance of a memory cell, a trench type cell and a stack type cell have recently been proposed and adopted as the cell structure of current DRAMs. A trench type cell has a capacitor formed in a trench in the substrate. A stack type cell has a capacitor three-dimensionally stacked above the MOS transistor.

More improved cell structures have also been proposed, particularly for stack type cells, such as a fin type cell and a cylinder type cell. A fin type cell has a plurality of storage electrodes disposed generally in parallel with the substrate and the upper and lower surfaces of each storage electrode are used as capacitor electrodes so that the capacitance per unit area occupied by a cell can be increased more than a stack type cell. A cylinder type cell has a cylindrical storage electrode disposed generally vertically to the substrate to increase the capacitance.

By using these cell structures and their manufacture processes, it becomes possible to realize DRAMs of 64 Mbit class with 0.35 $\mu$m design rule.

However, these technologies only are insufficient for higher integration such as DRAMs of 256 Mbit and 1 Gbit class with 0.25 $\mu$m to 0.15 $\mu$m design rule.

It is therefore necessary not only to reduce a substrate area occupied by a capacitor but to make as small as possible an alignment margin set for eliminating troubles to be caused by wiring shortages or the like during photolithography. It is also necessary to solve the problems associated with improved cell structures such as a cylinder type cell.

A first problem pertains to alignment.

A self align contact (SAC) method is already known as a method of forming a fine contact window. This method is disclosed, for example, in Japanese Patent Laid-open Publication No. 58-115859.

With this method, a first insulating film is formed on a gate electrode layer of a MOS transistor and patterned to form a gate electrode. After source/drain diffusion regions are formed, a second insulating film is formed and etched through anisotropic etching until the diffusion regions are exposed. Since an insulating film is formed on the side wall of a gate electrode portion including the first insulating film, the periphery of the gate electrode can be perfectly insulated with the first and second insulating films. Contact window areas can also be formed above the diffusion regions in a self alignment manner.

If the self align method is used for forming contact windows as described above, an alignment margin is not necessary between the underlying conductive layers (gate electrode and source/drain diffusion regions) and contact windows. The cell can be made fine correspondingly because the alignment margin is not necessary. Such a simple self align method is still unsatisfactory because multi-layer processes are used for making highly integrated DRAM cells finer.

An example of improved self align contact techniques used for DRAM cells will be described with reference to schematic cross sectional views of FIGS. 34A to 35B which illustrate manufacture processes.

FIGS. 34A and 34B and FIGS. 35A and 35B are cross sectional views of typical memory cell units taken along the direction crossing the word line direction (along the direction of source/drain of MOS transistors). With reference to these drawings, a method of forming contact windows by using the self-align contact technique will be described specifically, the contact windows being used for contact between each of bit lines and storage electrode with the source/drain diffusion region of the MOS transistor.

First, as shown in FIG. 34A, a gate insulating film 113 is formed on a silicon substrate 111 surrounded by a LOCOS oxide film 112. On this gate insulating film 113, a polysilicon layer 114 and a tungsten silicide layer 115 are deposited to form a polycide gate electrode. Source/drain regions 116 are formed on both sides of the gate electrode. A nitride film 117 is formed surrounding the periphery of the polycide gate electrode which corresponds to the word line.

The processes up to this are the same as the above-described self align contact method so that these processes can be executed in accordance with the method described in the Japanese Patent Laid-open Publication No. 58-115859.

Next, a silicon oxide film 118 is formed over the whole surface of the nitride film 117. The silicon oxide film 118 is planarized by chemical mechanical polishing (CMP) or the like to facilitate the succeeding processes.

Next, as shown in FIG. 34B, on the planarized oxide film 118, a resist layer is coated and patterned by usual photolithography to form a resist pattern 119 to be used as an etching mask.

Next, as shown in FIG. 35A, by using the resist pattern 119 as a mask, the oxide film 118 is etched to form contact windows 120 reaching the diffusion regions 116. In this case, the etching conditions of the oxide film is set so as to have a large etching selection ratio of the oxide film to the silicon nitride film. Therefore, even if the nitride film 117 is exposed while etching the oxide film, the nitride film is not etched so much and the areas generally the same as those of the self align contact windows first formed in the nitride film become new contact windows.

Next, the resist pattern 119 is removed by known techniques.

Then, as shown in FIG. 35B, a conductive layer 121 is formed on the contact windows.

With the above method, even if the contact windows are formed above or near the gate electrode because of displacement of the resist pattern 119, the conductive layer 121 and polycide electrode are not electrically short-circuited. Therefore, it is not necessary to have an alignment margin of the contact window relative to the polycide electrode.

According to this technique, contact windows can be formed in a self alignment manner, while planarizing the oxide film 118 serving as an interlayer insulating film.

Such self align contact (SAC) technique will be called hereinafter "nitride film spacer SAC".

The following problems occur when nitride spacer SAC is used.

One problem associated with the gate electrode structure formed by nitride film spacer SAC is the deteriorated transistor characteristics.

The problems of the gate electrode structure using a nitride film spacer side wall are described, for example, in IEEE TRANSACTIONS ON ELECTRON DEVICES, VOL. 38, NO. 3 MARCH 1991 "Hot-Carrier Injection Suppression Due to the Nitride-Oxide LDD Spacer Structure", T. Mizumo et. al.

This paper describes that as compared to a MOS transistor with an oxide film side wall, the electrical characteristics of a MOS transistor with a nitride film side wall are deteriorated greatly, for example, in the hot carrier effects, leading to a lower reliability. This may be ascribed to a larger number of traps in a silicon nitride film than in an oxide film.

The above paper discloses a method of preventing deterioration of transistor characteristics by forming an oxide film between the nitride film side wall and gate electrode and between the nitride film side wall and substrate so as to suppress the influence of the nitride film.

However, such a structure cannot be applied directly to the nitride film spacer SAC structure.

This problem will be explained with reference to FIGS. 36A to 37. Similar to FIGS. 34A and 34B and FIGS. 35A and 35B, cross sectional views of typical memory cell units shown in FIGS. 36A, 36B, and 37 are taken along the direction crossing the word line direction. In FIGS. 36A, 36B, and 37, similar elements to those shown in FIGS. 34A and 34B and FIGS. 35A and 35B are represented by using identical reference numerals.

FIG. 36A illustrates the processes corresponding to those of FIG. 34B, and shows a resist pattern 119 on an oxide film 118, which pattern is used for forming contact windows. A silicon nitride film 122 is formed on a polycide electrode constituted of a silicon film 114 and a silicide film 115, and a silicon nitride film 124 is formed via an oxide film 123 on the side wall of the laminated structure of the polycide electrode and silicon nitride film 122. Impurity doped regions 116 as source/drain diffused regions are formed in the substrate 111 on both sides of the gate electrode.

The resist pattern 119 is formed in order to form contact windows of the nitride film spacer SAC structure. In FIG. 36A, the resist pattern 119 is displaced because of misalignment.

If the oxide film 118 is etched in this state, the side wall oxide film 123 between the nitride film side wall 124 and polycide electrode is also etched at the same time, and the side wall of the gate electrode is exposed, as shown in FIG. 36B.

Next, as a wiring electrode 121 is formed in the contact window, as shown in FIG. 37 the gate electrode is electrically shorted to the wiring electrode 121 and diffusion regions 116 via the side wall of the exposed gate electrode.

In order to avoid such electrical short circuits, it is necessary to have an alignment margin and it is impossible to form contact windows in a self alignment manner. The nitride film side wall structure described in the above paper cannot be therefore applied to nitride film spacer SAC.

Another problem associated with nitride film spacer SAC is separation or peel-off of a silicide film to be caused by a combination of a polycide conductive layer and nitride film spacer SAC.

A polycide structure, which is a lamination structure of a silicon film and a silicide film such as tungsten silicide (WSi) and molybdenum silicide (MoSi), has a resistance lower than a silicon film and is widely used for gate electrodes, word lines, bit lines, and the like.

It has been found, however, that if the nitride film spacer SAC process is used with a polycide conductive film, stress is generated because of a difference of thermal expansion coefficient between the polycide film and nitride film and the silicide film can be separated at later heat treatments.

The conventional nitride film spacer SAC cannot be used therefore also for the wiring structure of bit lines or the like, which do not deteriorate transistor performances.

A second problem is associated with a process of forming a contact hole to expose a plug conductive film embedded in another contact window.

For highly integrated DRAM structures, a planarizing process is necessary for preventing breakage or the like of a wiring layer at later processes. For this reason, a structure is adopted which embeds a conductive film called a plug into a contact window.

A process of forming a contact window for contacting a plug with an upper wiring layer is desired to have a process margin relative to the position misalignment. It is also preferable to use SAC in forming a contact window because fine processing is possible.

Under the conditions that an insulating film surrounding a plug can be etched by the contact window forming process, it is not possible to have a process margin relative to the position misalignment and to use SAC. Therefore, a position alignment margin becomes necessary, which hinders high integration.

A third problem is associated with a method of forming a cylinder type storage electrode.

A cylinder type storage electrode utilizes the side wall portion of the cylinder as part of the capacitor of a memory cell. It is therefore necessary to make constant the side wall area of the cylinder in order to stabilize the capacitance.

Generally a cylinder type storage electrode is formed by forming an opening in an insulating film, leaving a conductive layer as the storage electrode only on the side wall and bottom of the opening, and thereafter etching and removing the insulating film.

With these processes, the exposed area of the outer side wall of a cylinder type conductive layer used as the storage electrode changes with an amount of etching the insulating film on the outer side wall of the storage electrode.

A fourth problem is associated with a process of forming a contact window for a conductive layer having a large step.

The structure capable of increasing the area of a storage electrode by using a three-dimensional structure such as a cylinder type cell described above has been studied in order to procure a sufficient capacitance even with a small cell area. A height of the storage electrode is required to be made greater in order to procure a sufficient capacitance. Therefore, a height difference (step) between a cell area and a peripheral circuit area becomes large.

Such a step poses not only a problem of breakage of wiring at the step, but also another problem. Namely, a size accuracy is lowered when wirings over the cell area and peripheral circuit area are patterned, because of an insufficient depth of focus.

There is a method of solving these problems, as disclosed in Japanese Patent Laid-open Publication No. 3-155663, which embeds concaved areas on the surface of an insulating film with a coated insulating film such as spin on glass (SOG) and resist and thereafter etches it back, or planarizes the insulating film formed on uneven cell and peripheral circuit areas through chemical mechanical polishing (CMP).

A problem of a shallow depth of focus can be solved through such planarization. However, following new problems occur.

A DRAM structure has a number of conductive layers which are connected to upper metal wiring layers, including MOS transistor source/drain diffusion regions, word lines, and bit lines respectively in a peripheral circuit area, bit lines, capacitor opposing electrodes, and the like in the memory cell area.

These conductive layers are not formed at the same layer level, but are formed as a multi-layer structure having interlayer insulating films. Therefore, distances of conductive layers from the substrate are different.

If the higher level insulating film is planarized by the above-described processes, the surface of the insulating film is made generally parallel to the substrate surface so that depths of contact holes formed in the insulating film become different.

Therefore, if these contact holes are formed by a single photolithography process, until the lowermost conductive layer—diffusion region—is exposed, the uppermost conductive layer for which contact hole has already formed is exposed in an etching atmosphere for a long time.

An etching selection ratio of the insulating film to the conductive layer cannot be set too high. Therefore, the contact window for the uppermost conductive layer can penetrate into the lower insulating film. At the worst, another conductive layer under the excessively etched contact window can be electrically short-circuited.

In order to form a highly reliable contact hole without electrical short of the lower level wiring layer, it is essential to increase the number of processes, for example, to divide the single photolithography process into a plurality of processes.

A fifth problem is associated with planarization.

DRAM manufacture processes become complicated and the number of processes increases, as the degrees of integration and fine processing become high. These may become a factor of lowering product yields and ultimately raising the cost.

Multi-layer wiring processes are used for high integration. Planarization of insulating layers and wiring layers is therefore important.

Planarizing technology without complicated manufacture processes is therefore desired.

A sixth problem is associated with electrical characteristics of MOS transistors.

As integration becomes higher, MOS transistors are made finer which may cause deteriorated transistor characteristics and lowered reliability.

SUMMARY OF THE INVENTION

It is an object of the present invention to provide technology capable of applying nitride film spacer SAC to a polycide structure and allowing fine processing and high integration of DRAM memory cells.

It is another object of the present invention to provide technology capable of utilizing an SAC structure while providing a sufficient process margin relative to misalignment with a plug.

It is another object of the present invention to provide technology capable of producing a stable capacitance by making constant an exposed area of the outer side wall of a cylinder type storage electrode.

It is another object of the present invention to provide technology capable of forming contact windows in one photolithography process even when the depths of the windows are different, and hence reducing the number of manufacturing steps.

It is another object of the present invention to provide technology capable of simplifying manufacture processes by applying a planarizing step to nitride film spacer SAC.

It is another object of the present invention to provide a MOS transistor structure with improved characteristics capable of being used for DRAM memory cells.

According to one aspect of the present invention, there is provided a semiconductor device comprising: a semiconductor substrate having an insulating surface; a conductive pattern disposed on the insulating surface of the semiconductor substrate, the conductive pattern including at least one layer of metal or metal silicide; a first insulating film made of an insulating material other than silicon nitride formed to cover at least a side wall of the conductive pattern; and a second insulating film made of silicon nitride formed to continuously cover the conductive pattern and the first insulating film.

According to another aspect of the present invention, there is provided a method of manufacturing a semiconductor device comprising the steps of: forming a conductive layer including at least one layer of metal silicide on a semiconductor substrate; depositing a first silicon nitride film on the conductive layer to form a lamination; patterning the lamination; forming an oxide film on a side wall of the conductive layer by thermal oxidation; forming a second silicon nitride film on the semiconductor substrate including the patterned lamination and oxide film on the side wall; and anisotropically etching the second silicon nitride film to form a side spacer of the second silicon nitride on the side wall of the lamination inclusive of the oxide film on the side wall.

The upper surface and side area of a conductive layer are continuously covered with a nitride film, and an insulating film such as an oxide film is inserted between at least the side wall of the conductive layer and the nitride film. It becomes therefore possible to prevent separation of the metal silicide film constituting the gate electrode and to use nitride film spacer SAC. Furthermore, this structure contributes to making DRAMs finer, increasing a manufacture margin, shortening the manufacture process, and the like.

BRIEF DESCRIPTION OF THE DRAWINGS

FIGS. 3A to 14 are schematic cross sectional views illustrating first DRAM manufacture processes according to another embodiment of the invention.

FIGS. 17A to 23 are schematic cross sectional views illustrating fourth DRAM manufacture processes according to another embodiment of the invention.

DETAILED DESCRIPTION OF THE PREFERRED EMBODIMENTS

Figure 1A:
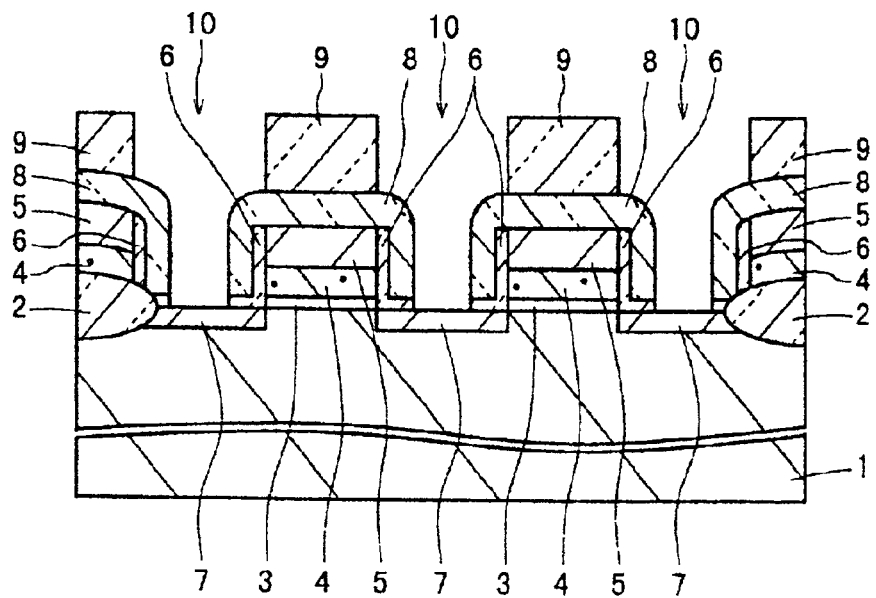
FIGS. 1A and 1B are cross sectional views illustrating a fundamental embodiment according to the invention.
Figure 1B:
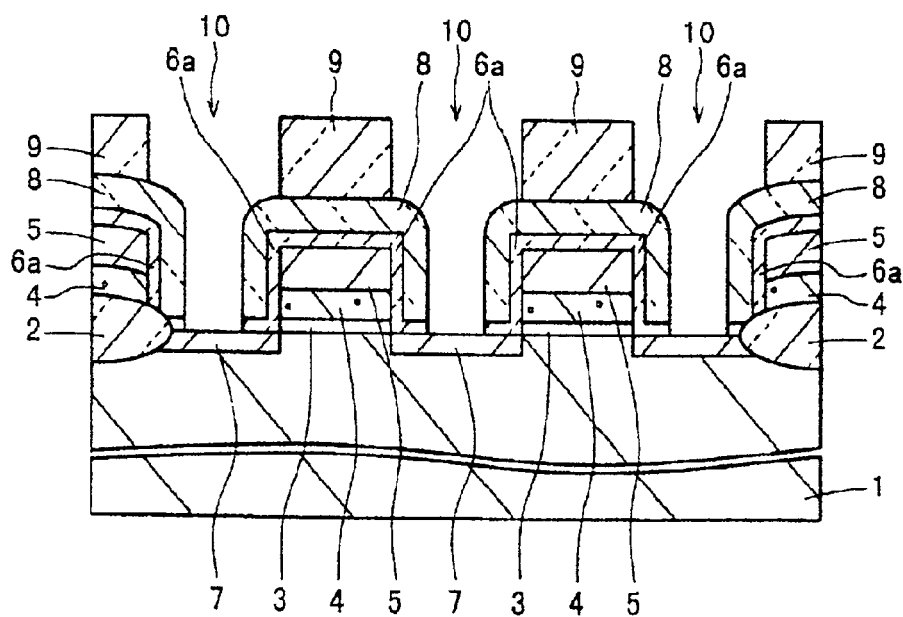

Embodiments of the invention will be described with reference to the accompanying drawings. FIGS. 1A and 1B show a semiconductor device and its modification according to the fundamental embodiment of the invention.

In FIG. 1A, reference numeral 1 represents a silicon substrate, reference numeral 2 represents a field insulating film, reference numeral 3 represents a gate oxide film, reference numeral 4 represents a silicon film, reference numeral 5 represents a silicide film, reference numeral 6 represents a silicon oxide film, reference numeral 7 represents an impurity diffused region, reference numeral 8 represents a silicon nitride film spacer, reference numeral 9 represents an interlayer insulating film, and reference numeral 10 represents a contact window.

An active region on the substrate 1 is defined by the field insulating film 2. On the gate oxide film 3 on the active region, a gate electrode is formed which is a lamination of the silicon film 4 and silicide film 5. The silicon nitride film 8 covers the upper surface and side area of the gate electrode. The oxide film 6 is disposed under the silicon nitride film 8 serving as the side spacer and between the side wall of the gate electrode and the side spacer nitride film.

Since the oxide film 6 is disposed under the silicon nitride film 8 serving as the side spacer, most of hot carriers generated at the MOS transistor channel are trapped in the oxide film 6. The MOS transistor characteristics are less influenced by the silicon nitride film 8. Therefore, almost the same reliability as a conventional MOS transistor using an oxide film side wall spacer can be ensured.

Since the oxide film 6 between the side wall of the gate electrode and the nitride film functions as a relaxation film between the silicide film 5 and nitride film 8, the silicide film can be prevented from being separated from the silicon film 4 at later heat treatments or the like.

Also since the silicon oxide film 6 exists only on the side wall of the gate electrode and is not exposed on the upper surface of the gate electrode structure, the contact window 10 can be formed by using nitride film spacer SAC, without posing a problem of an electrical short circuit between a conductive layer and the gate electrode even if the mask is displaced, as described with conventional techniques. Although a MOS transistor having a gate oxide film is described, a MIS transistor having a gate insulating film other than an oxide film may be formed. The gate electrode may be formed of a conductive material including metals or its lamination other than polycide.

FIG. 1B shows another example of the fundamental embodiment of the invention.

In FIG. 1B, reference numeral 1 represents a silicon substrate, reference numeral 2 represents a field insulating film, reference numeral 3 represents a gate oxide film, reference numeral 4 represents a silicon film, reference numeral 5 represents a silicide film, reference numeral 7 represents an impurity diffused region, reference numeral 8 represents a silicon nitride film spacer, reference numeral 9 represents an interlayer insulating film, reference numeral 10 represents a contact window, and reference numeral 6a represents a silicon oxide film. In FIG. 1B, elements similar to those shown in FIG. 1A are represented by using identical reference numerals.

As compared to the structure shown in FIG. 1A, the silicon oxide film 6a is formed also on the silicide film 5 constituting the gate electrode to completely cover the upper surface and side wall of the gate electrode with it. With this structure, since the silicon nitride film 8 and silicide film 5 do not contact directly, the structure more resistant to separation at later heat treatments or the like can be provided.

The structures shown in FIGS. 1A and 1B are applicable not only to a MOS transistor gate electrode but to other wiring layers such as bit lines having a polycide structure.

More concrete embodiments will be described hereinbelow. Identical reference numerals are used in each embodiment for same or similar elements.

1st DRAM

Figure 2:
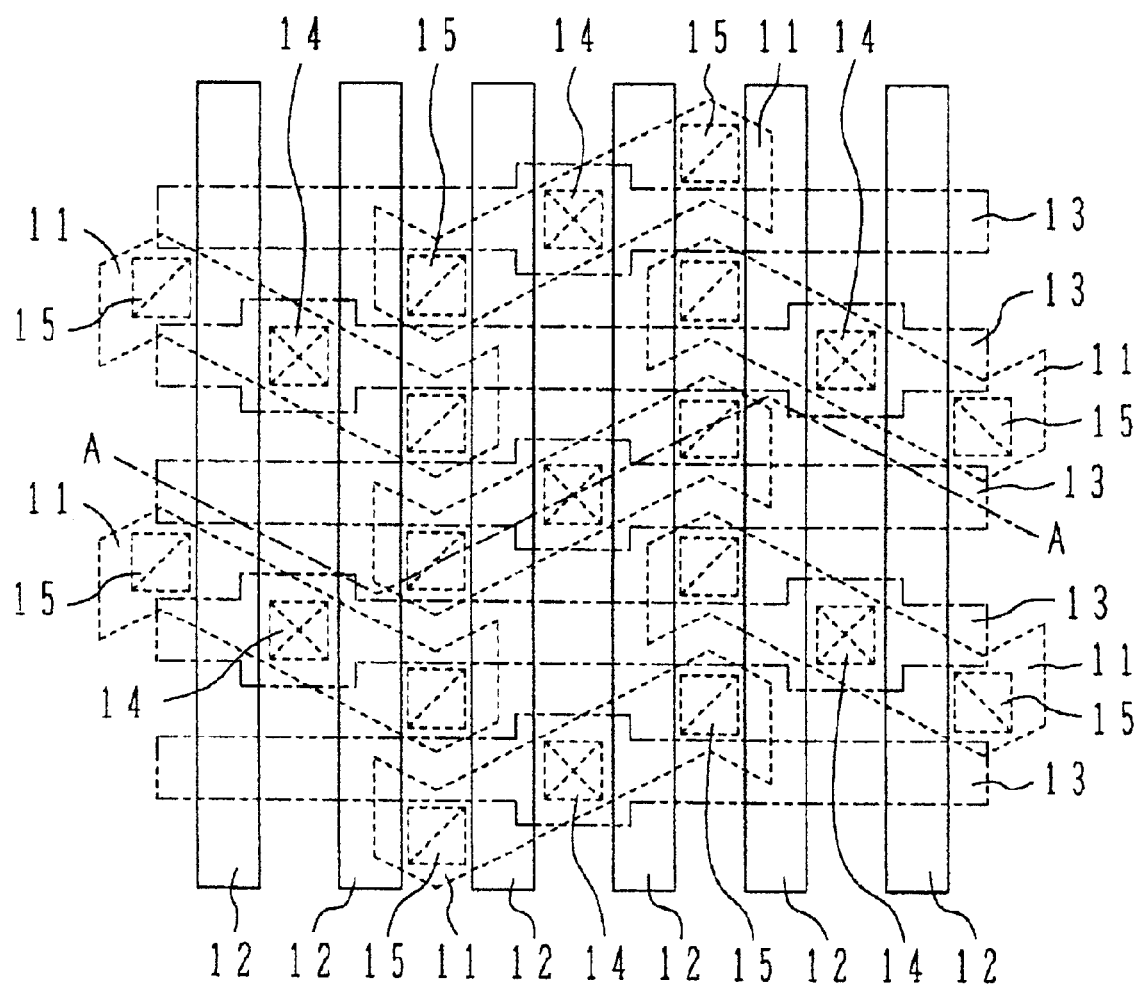
FIG. 2 is a schematic plan view showing a memory cell area.

FIG. 2 is a schematic plan view of a DRAM memory cell area. In FIG. 2, reference numeral 11 represents an active region, reference numeral 12 represents a word line of MOS transistors also serving as gate electrodes, reference numeral 13 represents a bit line, reference numeral 14 represents a contact window for contact between the bit line and source/drain diffusion region of a MOS transistor, and reference numeral 15 represents a contact window for contact between a cylinder type storage electrode and source/drain region of a MOS transistor. Wiring layers such as back-up wiring lines formed on gate electrodes or bit lines are not shown in FIG. 2.

Next, with reference to FIGS. 3A to 13, a method of forming contact windows of DRAM by self align contact (SAC) techniques will be specifically described. FIGS. 3A to 13 are schematic cross sectional views showing a memory cell area taken along line A—A of FIG. 2 and a typical wiring structure of a peripheral circuit area. It may be noted that line A—A crosses both the word line 12 and the bit line 13.

Figure 3A:
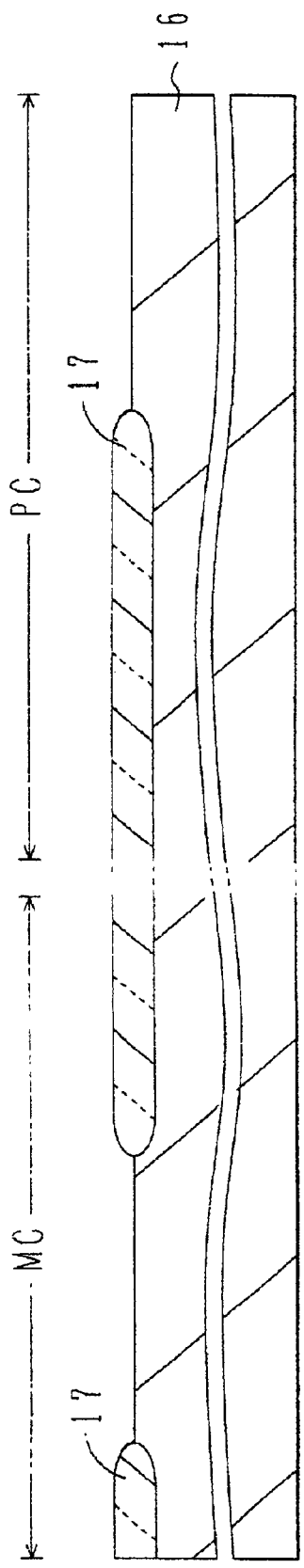

First, as shown in FIG. 3A, on a p-type silicon substrate 16, a thick oxide film (field oxide film) 17 is formed by well known LOCOS (local oxidation of silicon) to thereby define element isolation regions and active regions. Reference characters MC represent a memory cell area, and PC represents a peripheral circuit area.

Various circuits are formed in the peripheral circuit area. For these circuits, n- and p-channel MOS transistor regions are generally formed in this area.

The p-channel MOS transistor area may be an n-type well formed in a p-type silicon substrate, and the n-channel MOS transistor area may be a p-type well formed in the p-type silicon substrate or a p-type well (triple-well structure) formed in an n-type well in the p-type silicon substrate. These structures may be selected as desired according to the design characteristics. For example, reference may be made to U.S. patent application, Ser. No. 08/507,978, filed on Jul. 27, 1995, now U.S. Pat. No. 5,780,907, claiming priority of Sep. 22, 1994, which is incorporated herein by reference.

Although not shown, after or before LOCOS, p-and n-type impurity ions are implanted into the active regions of the peripheral circuit area to form p- and n-type wells. In a partial area of each n-type well, p-type impurities are doped to form a p-type well whose bottom and side are surrounded by the n-type well.

If necessary, channel stopper regions are formed under the field oxide film 17 by implanting p- or n-type impurity ions depending upon the conductivity type of impurities in wells.

Although not shown, impurities for the control of threshold values (Vth) are doped in the active regions depending on the characteristics of MOS transistors.

Ion implantation processes for these wells, channel stopper regions, and Vth control are not required to be executed at this stage, but obviously they may be executed after a gate oxide film forming process, a gate electrode forming process, or the like which will be later described sequentially.

Figure 3B:
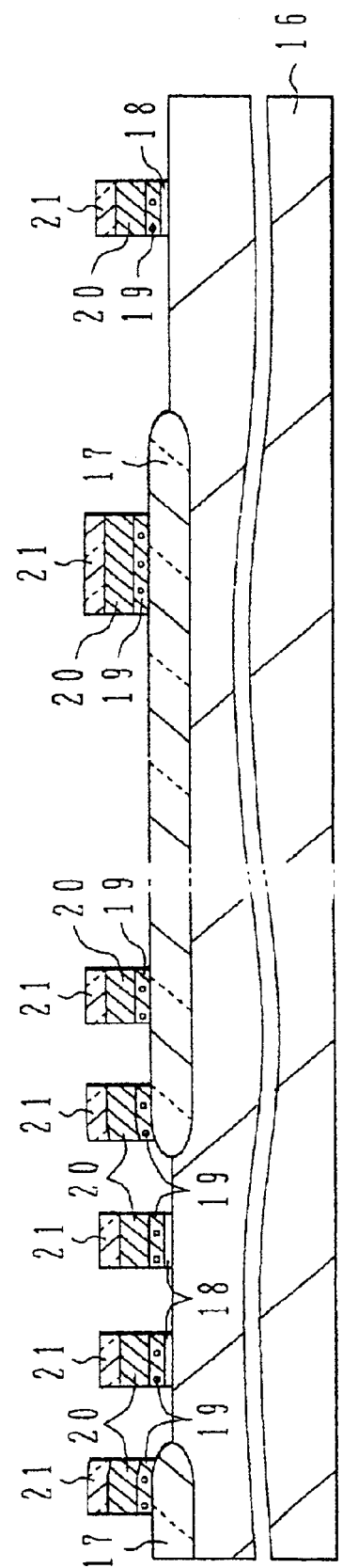

Next, as shown in FIG. 3B, the substrate surface is oxidized to form a gate oxide film 18 which is 8 nm thick. On this gate oxide film 18, a phosphorous doped silicon film 19 having a thickness of 50 nm, a tungsten silicide (WSi) film 20 having a thickness of 50 nm, and a silicon nitride film 21 having a thickness of 80 nm are sequentially deposited by well known CVD (chemical vapor deposition).

The lamination of these films is patterned to a desired shape by photolithography to form MOS transistor gate structures. In the cell area, the polycide structure of the lamination becomes the word line (corresponding to 12 in FIG. 2).

Next, as shown in FIG. 4A, heat treatment in an oxidizing atmosphere is performed to thermally grow an oxide film 22 to 2 to 10 nm thick. This oxidation forms an oxide film only on the side wall of the polycide structure of the silicon film 19 and WSi film 20 and on the surface of the silicon substrate 16 at the active region. This oxide film is not formed on the surface of the silicon nitride film 21 including its side wall because the silicon nitride film 21 is not oxidized. Since the silicon film 19 has an impurity concentration higher than the substrate 11, the oxide film 22 on the side wall of the silicon film 19 becomes thicker than on the substrate surface. Next, by using the gate electrode structure as a mask, n-type impurity ions, phosphorous, are doped at a dose of $1\times10^{13}$ cm$^{-2}$ over the whole surface of the substrate. An impurity doped region 23 corresponding to an n$^-$-type region of an LDD (lightly doped drain) structure is therefore formed in the n-channel MOS transistor region.

In this case, these n-type impurities are also doped in the p-channel MOS transistor region. However, this region substantially disappears at the later process of high concentration p-type impurity ion implantation so that there is no practical problem. Further, if this n-type impurity region is controlled to be left at the periphery of the p-type impurity diffusion region serving as a source/drain region, it functions as a punch-through preventing region.

Next, as shown in FIG. 4B, a silicon nitride film is deposited by CVD to a thickness of 50 to 150 and aniso- tropically etched by well known RIE (reactive ion etching) to form a nitride film side wall spacer on the side wall of the gate electrode.

In this case, it is preferable that the etching is stopped by leaving the oxide film 22 not covered with the nitride film 21 present on the substrate 16 or the like, because etching damages to the substrate can be suppressed. However, it is not always required to leave it.

This side wall nitride film becomes in unison with the nitride film 21 on the polycide electrode and continuously covers the upper surface and side surface of the gate electrode, forming a nitride film region 24.

At this process, although the periphery of the polycide electrode made of the silicon film 19 and WSi film 20 is covered with the nitride film region 24, the oxide film 22 exists on the side wall of the polycide electrode. It is therefore possible to prevent the WSi film 20 from being separated from the substrate at later heat treatments or and the like.

Next, an oxide film is grown to 2 to 10 nm by thermal oxidation. In this case, this oxidation may be performed after removing the oxide film 22 exposed over the silicon substrate by hydrofluoric acid containing etchant. Although it is preferable to remove this exposed oxide film, from the viewpoint of controllability of film thickness, there is a danger of etching also the field oxide film 17 and the oxide film 22 under the side wall nitride film.

With this oxidation, mainly the surface of the active region of the silicon substrate is oxidized and this oxidized film becomes in unison with the oxide film 22. The silicon film 19 and WSi film 20 covered with the nitride film region 24 are not oxidized. In this embodiment, this unified oxide film is collectively called hereinafter an oxide film 22.

Next, a resist pattern is formed exposing the n-channel MOS transistor region in the peripheral circuit area excepting the memory cell area. By using the gate electrodes with the nitride film region 24 as a mask, n-type impurity ions, arsenic, are implanted at a dose of $5\times10^{15}$ cm$^{-2}$ into the opening area of the resist pattern. In the n-channel MOS transistor region in the peripheral circuit area, an impurity diffusion region 25 of high concentration is formed as the n$^+$-layer of the LDD structure.

The reason why n-type impurity ions are not implanted into the source/drain regions of transistors in the memory cell area is to prevent crystal detects to be formed by implantation of ions at a high impurity concentration and suppress leak current from a capacitor which stores small electric charges.

Next, a resist pattern is formed exposing the p-channel MOS transistor region in the peripheral circuit area. By using the gate electrodes with the nitride film region 24 as a mask, BF$_2^+$ions are implanted at a dose of $5\times10^{15}$ cm$^{-2}$ into the opening area of the resist pattern to form an impurity diffusion region serving as a source/drain region of the p-channel MOS transistor.

Figure 5A:
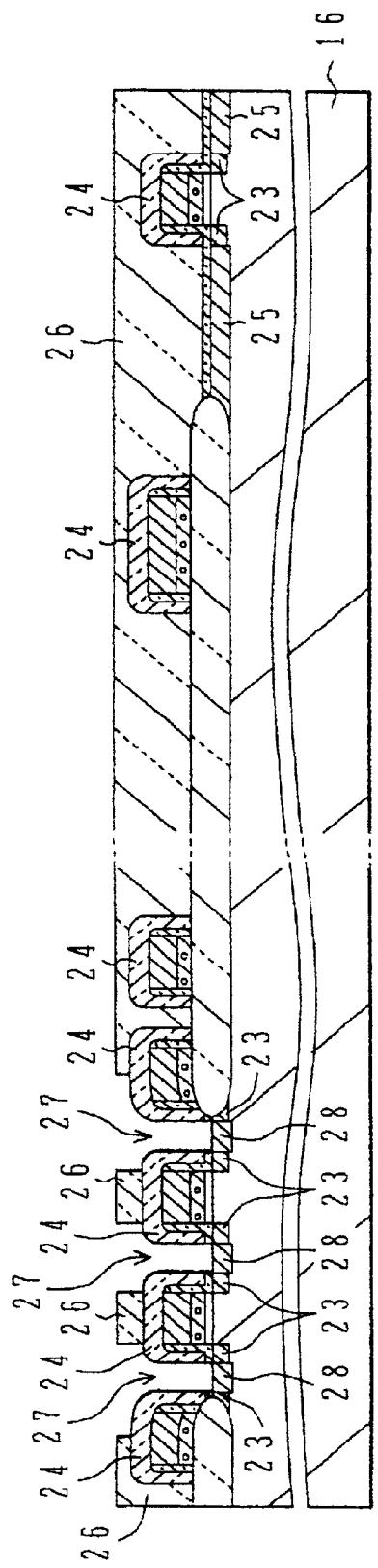

Next, as shown in FIG. 5A, a borophosphosilicate glass (BPSG) film 26 is grown to a thickness of 100 to 200 nm by CVD, and thereafter, heat treatment is performed at a temperature of 750 to 900° C. to planarize the surface of the BPSG film 26 through reflow.

Etch-back or CMP may be used to further planarize the surface, or a combination of these processes may be used for planarization.

If etch-back or CMP is used, the BPSG film is grown thicker correspondingly by an amount to be removed, in order to set the film thickness after etch-back or CMP to 100 to 200 nm.

Next, a resist pattern is formed having an opening which exposes the source/drain regions of a MOS transistor in the memory cell area. By using this resist pattern as a mask, the BPSG Film 26 and oxide film 22 exposed in the opening are sequentially etched by RIE using, for example, mixed gas of $C_4F_8$ and CO to thereby expose the substrate surface and form a contact window 27.

The bottom of the contact window 27 is defined in a self alignment manner by the spacer of the nitride film region 24. Since the side surface of the polycide gate electrode is all covered with the nitride film and the oxide film is not exposed, the oxide film is not etched and removed even if there is misalignment of the opening of the resist pattern.

Figure 35A:
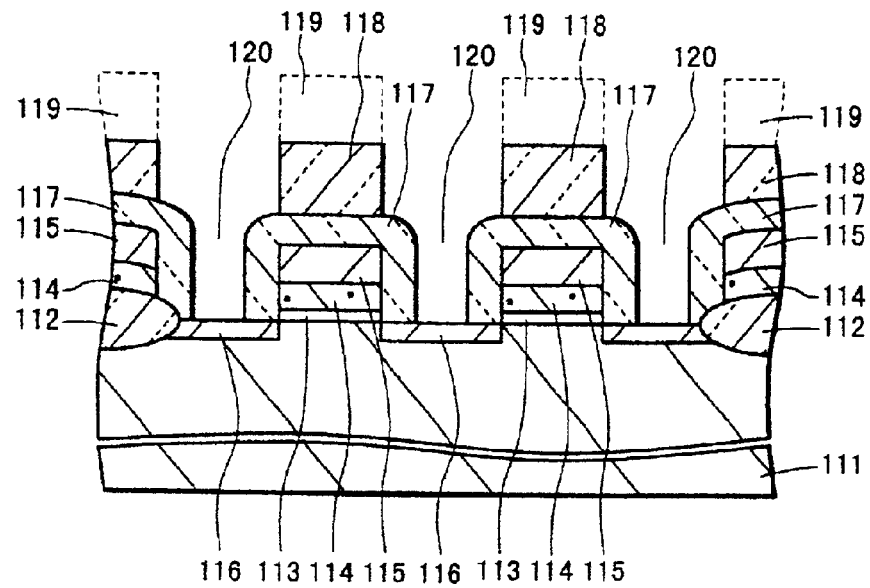
Figure 35B:
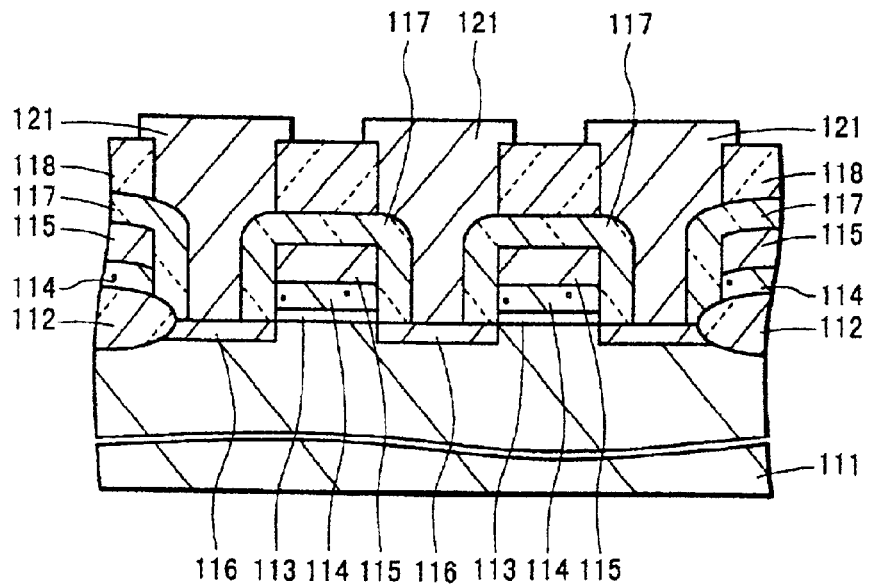
Figure 36A:
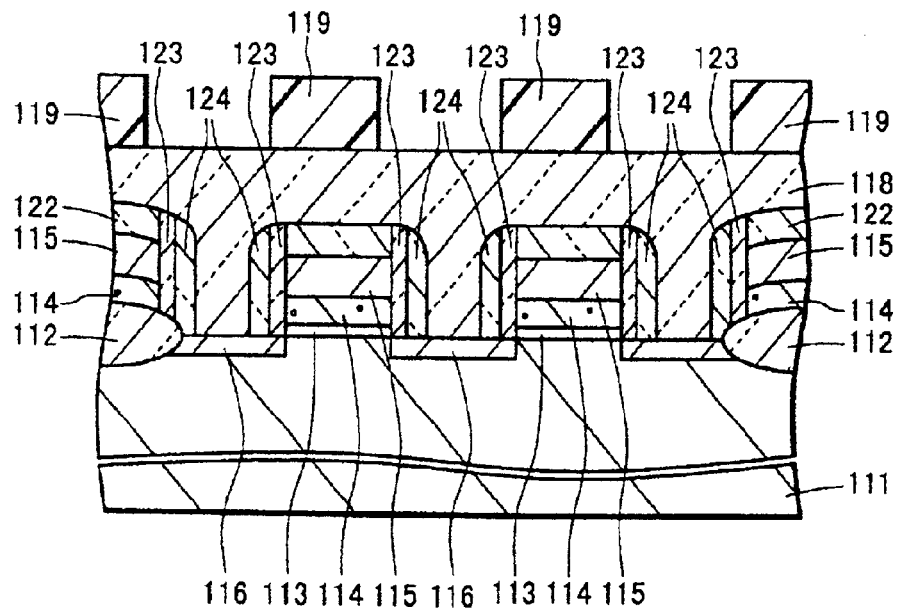
FIGS. 36A and 36B and FIG. 37 are schematic cross sectional views used for explaining problems associated with conventional techniques.
Figure 36B:
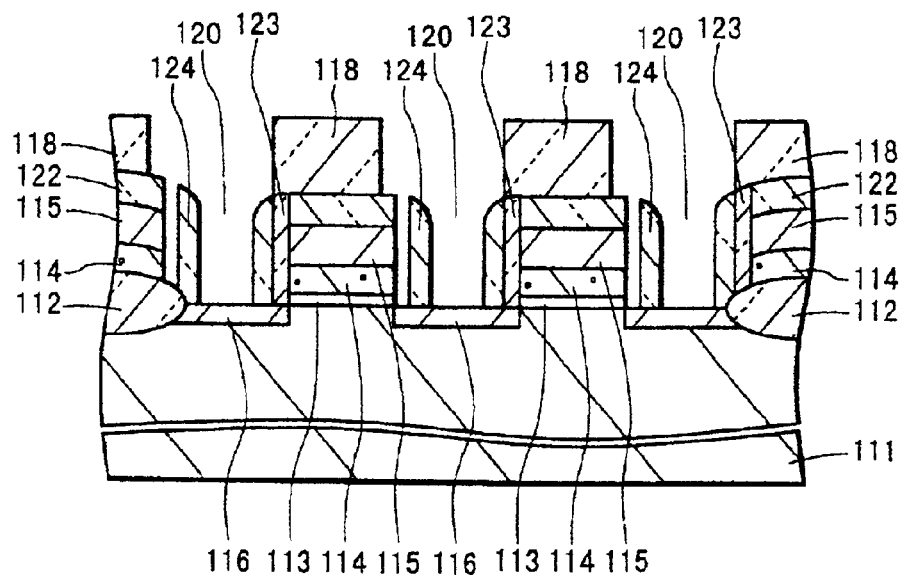
Figure 37:
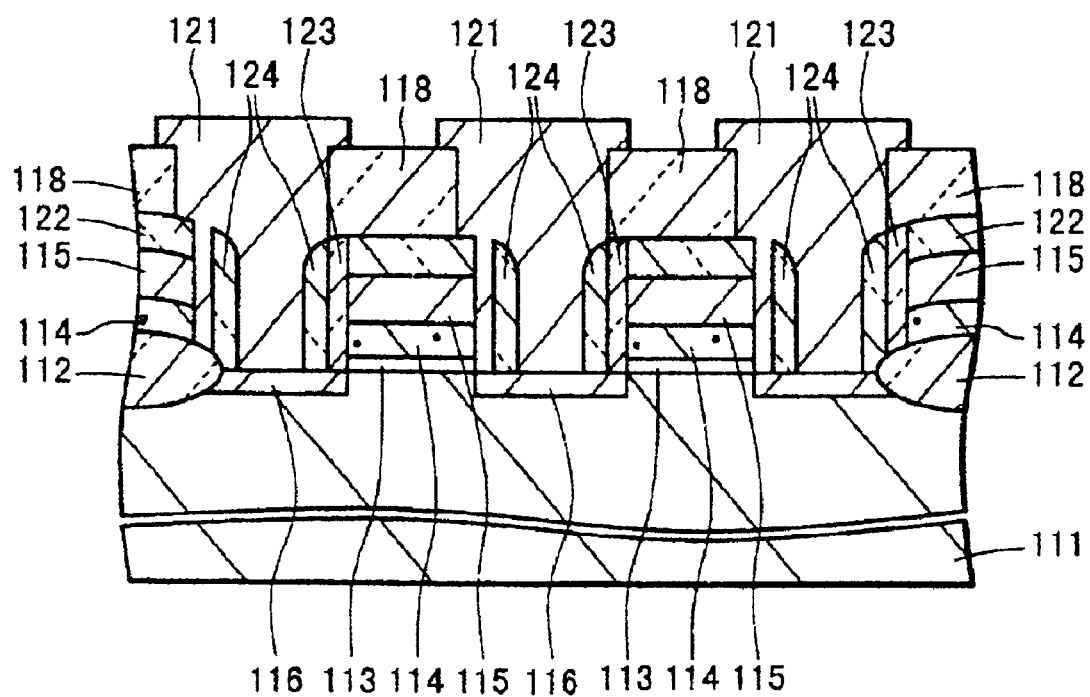

Therefore, the gate electrode and contact electrode will not be electrically shorted as in the case of conventional techniques described with FIGS. 35A and 35B.

Etching the BPSG film 26 and oxide film 22 is preferably performed under the conditions that an etching selection ratio of the BPSG film 26 and oxide film 22 to the nitride film is 10 or higher so as not to etch the nitride film region 24.

Next, after the resist pattern is removed, by using the BPSG film 26 and nitride film region 24 as a mask, n-type impurity ions, phosphorus, are implanted at a dose of $3 \times 10^{13}$ cm$^{-2}$ into the silicon substrate exposed in the contact window 27 to thereby form an n-type diffusion region 28. The dose for this n-type diffusion region 28 in this embodiment is smaller by double digits than that of the n-type diffusion region 25.

Although this n-type diffusion region 28 is not necessarily required, presence of this region solves a problem of large junction leak near at the edge portion of the field oxide film 17 where n-type impurities for forming the source/drain region are not implanted, even if the contact hole 27 is displaced and formed riding over the edge portion of the field oxide film 17.

Figure 5B:
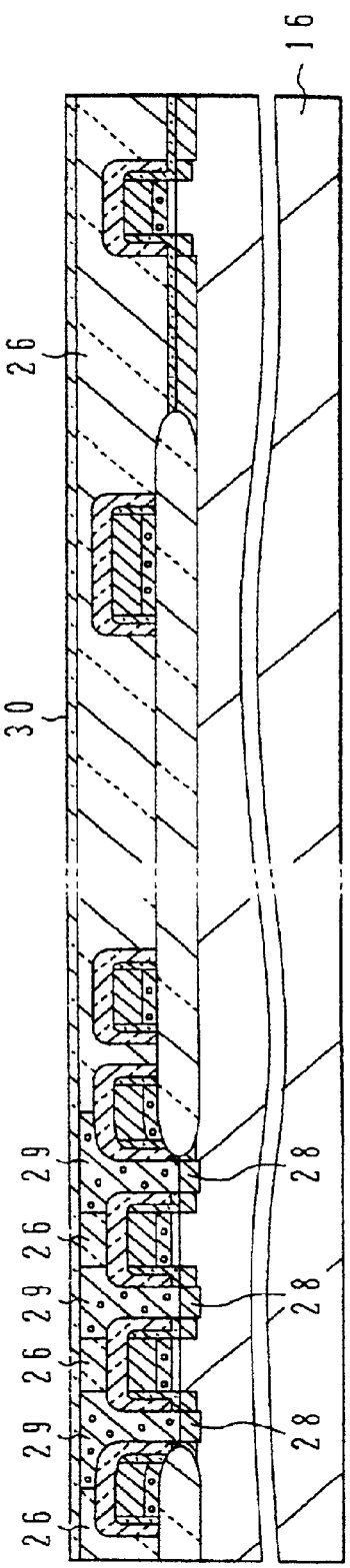

Next, as shown in FIG. 5B, a phosphorus doped silicon film is formed by CVD over the whole surface of the substrate, and a plug 29 of the silicon film is left in the contact hole by etch-back or CMP.

The plug 29 of silicon may be formed by selective CVD without using etch-back or CMP.

An oxide film 30 is then formed by CVD to a thickness of 30 to 100 nm.

Next, as shown in FIG. 6A, a resist pattern having an opening at a bit line connection area is formed. By using this resist pattern as a mask, the oxide film 30 is etched to form a contact window 31 exposing part of the upper surface of the silicon plug 29. Thereafter, the resist pattern is removed.

Next, a phosphorus doped silicon film 32 of 30 nm thick, a WSi film 33 of 50 nm thick, and a silicon nitride film 24 of 80 nm are sequentially formed by CVD.

The lamination of these films is patterned to have a desired wiring pattern by well know photolithography. The polycide electrode of this lamination forms a bit line (13 in FIG. 2) in the memory cell area, and is also used as a wiring layer other than the bit line in the peripheral circuit area.

Next, as shown in FIG. 6B, an oxide film 35 is grown to a thickness of 2 to 10 nm by thermal oxidation. The oxide film is therefore formed on the side wall of the polycide structure of the silicon film 32 and WSi film 33. Since the silicon nitride film is not oxidized, no oxide film is formed on the side wall of the silicon nitride film 34.

A silicon nitride film is formed to a thickness of 50 to 150 nm and anisotropically etched by RIE to form a spacer of nitride on the side wall of the bit line. The sidewall nitride film is made in unison with the nitride film 34 on the polycide electrode and becomes a nitride film region 36 continuously covering the upper surface and side surface of the polycide electrode.

With the above process, the periphery of the polycide electrode of the silicon film 32 and WSi film 33 is covered with the nitride film region 36. Since the oxide film 35 is formed on the side wall of the polycide electrode, the WSi film 33 can be prevented from being separated from the substrate, at later heat treatments or the like.

Figure 7:
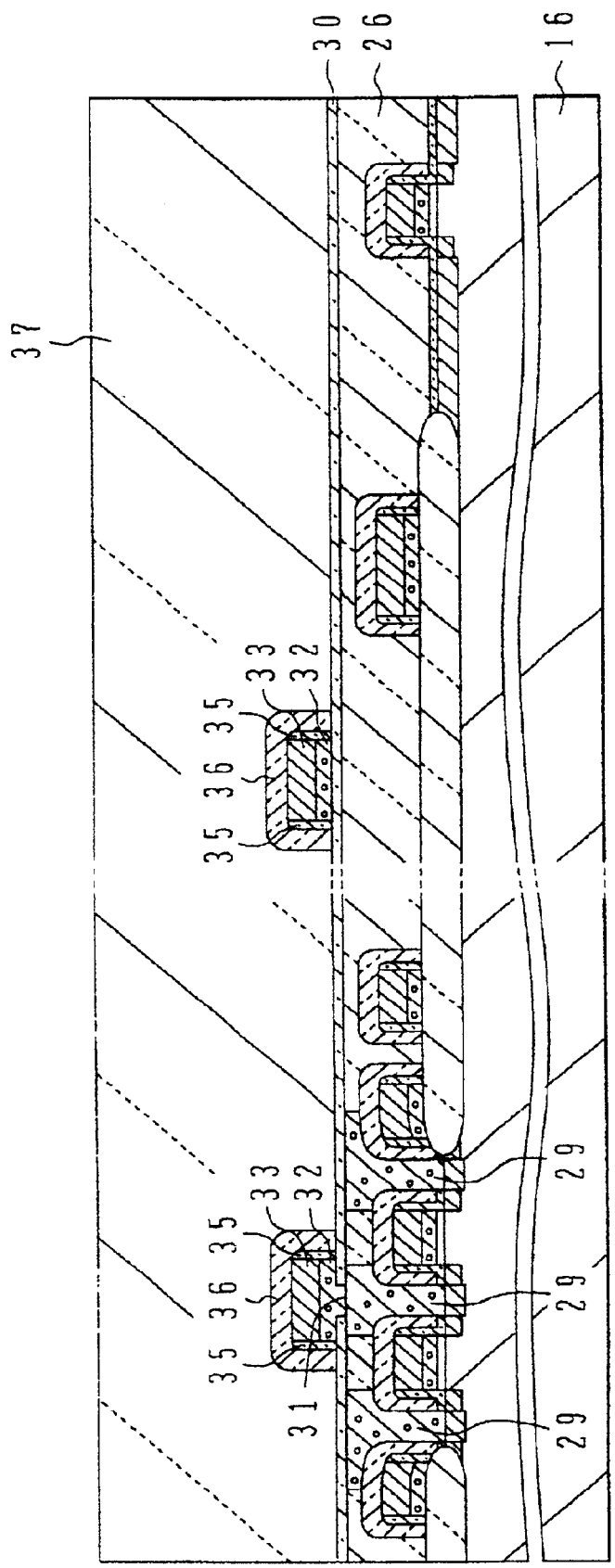

Next, as shown in FIG. 7, a BPSG film 37 is grown to a thickness of 500 nm by CVD, and thereafter heat treatment is performed at a temperature of 750 to 900° C. to planarize the surface thereof by reflow.

For further planarization, etch-back or CMP may be used or a combination thereof may be used.

If etch-back or CMP is used, the BPSG film is grown thicker correspondingly by an amount to be removed, to thereby set the film thickness after etch-back or CMP to 500 nm.

The thickness of the BPSG film 37 is one of the factors which determine the capacitance of a memory capacitor if the cylinder type storage electrode is used. Therefore, if a large capacitance is necessary, the film thickness of the BPSG film 37 is made thicker than 500 nm.

Figure 8:
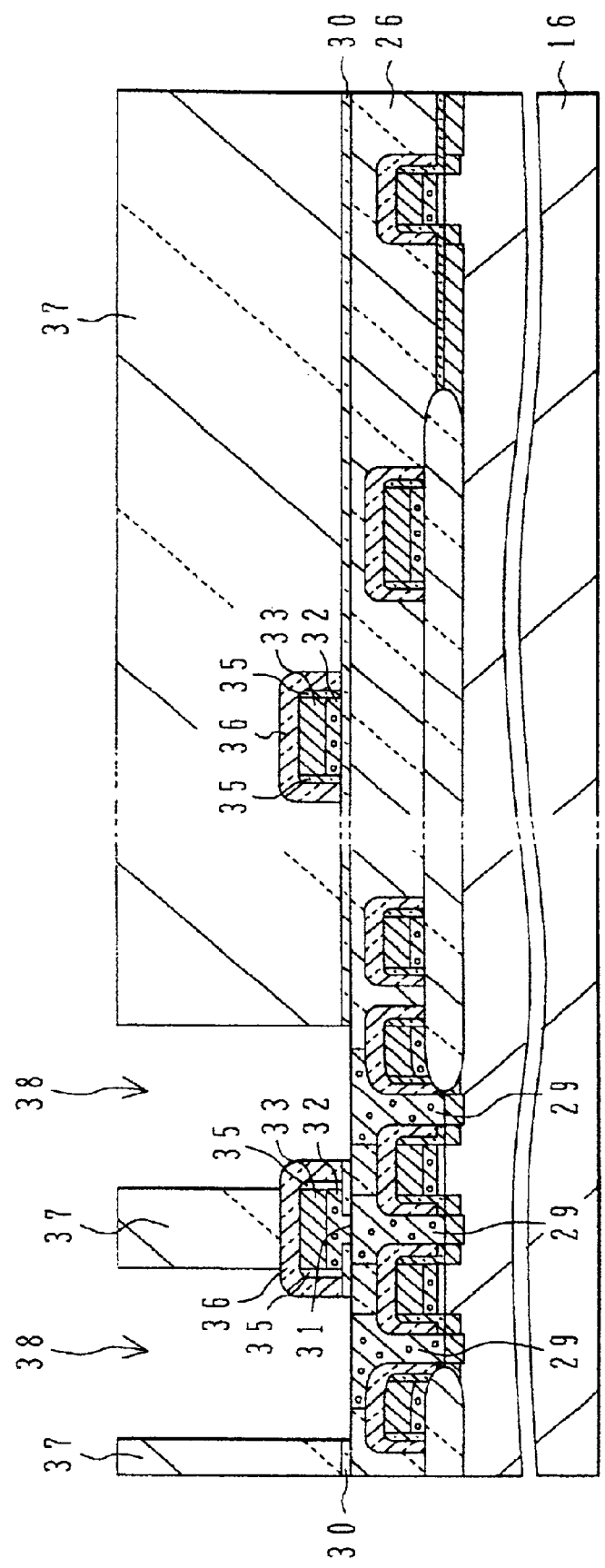

Next, as shown in FIG. 8, a resist pattern having an opening exposing a capacitor connection area is formed. By using this resist pattern as a mask, the BPSG film 37 and oxide film 30 are sequentially etched by RIF using, for example, mixed gas of $C_4F_8$ and CO to form a contact window 38 exposing the upper surface of the silicon plug 29.

If a cylinder type storage electrode is used, the size of the contact window 38 is generally related to the bottom area and its circumferential length of the cylinder type storage electrode. Therefore, in order to increase the capacitance, it is desired to form a contact window as large as possible.

In this embodiment, the contact window 38 is defined in self alignment with the bit line because of the nitride film region 36. Therefore, the contact window can be extended to the upper portion of the polycide electrode serving as the bit line so that the bottom area and its circumferential length can be increased.

Furthermore, since the periphery of the polycide electrode (bit line) is completely covered with the nitride film region 36 which is not etched and removed, the bit line and storage electrode are not electrically shorted.

Etching the BPSG film 37 and oxide film 30 is preferably performed under the conditions that the etching selection ratio of the BPSG film 37 and oxide film 30 to the nitride film is 10 or higher.

Figure 9:
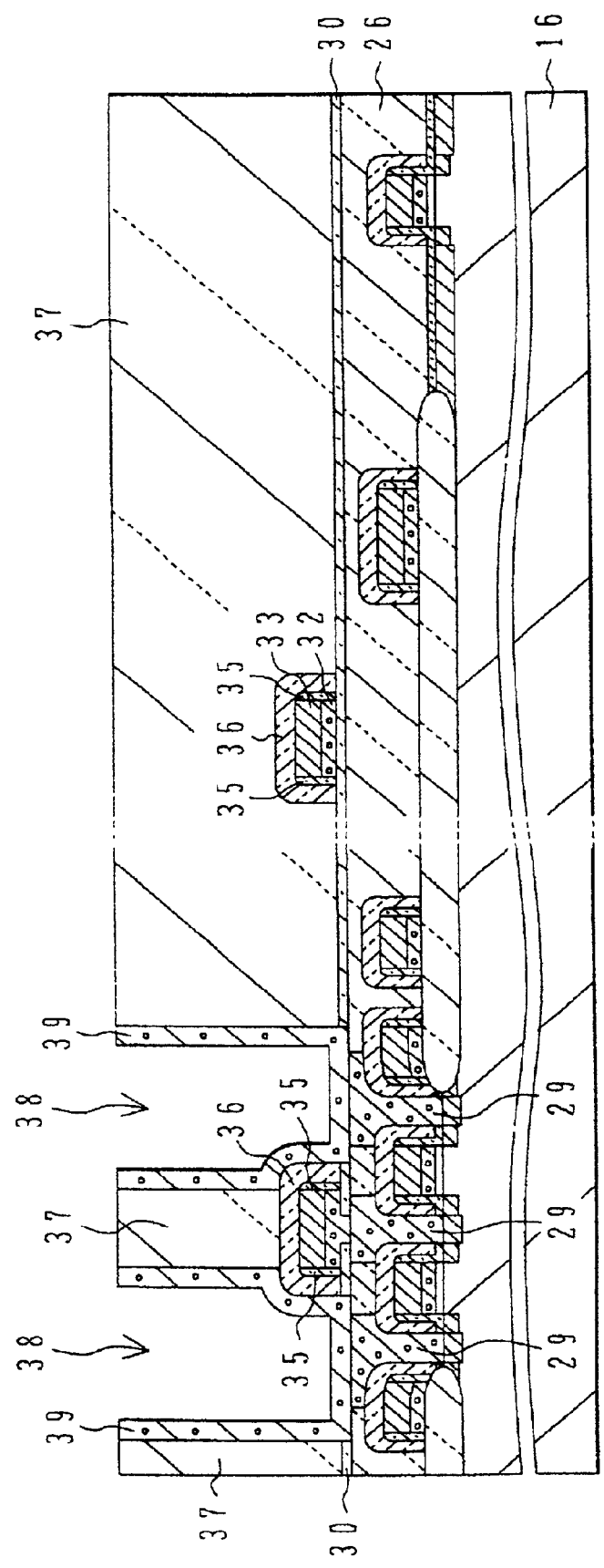

Next, as shown in FIG. 9, after the resist pattern is removed, a phosphorous doped silicon film is formed by CVD to a thickness of 50 nm and etched by etch-back or CMP to leave a silicon film 39 only on the side wall and bottom of the contact window 38.

Figure 10:
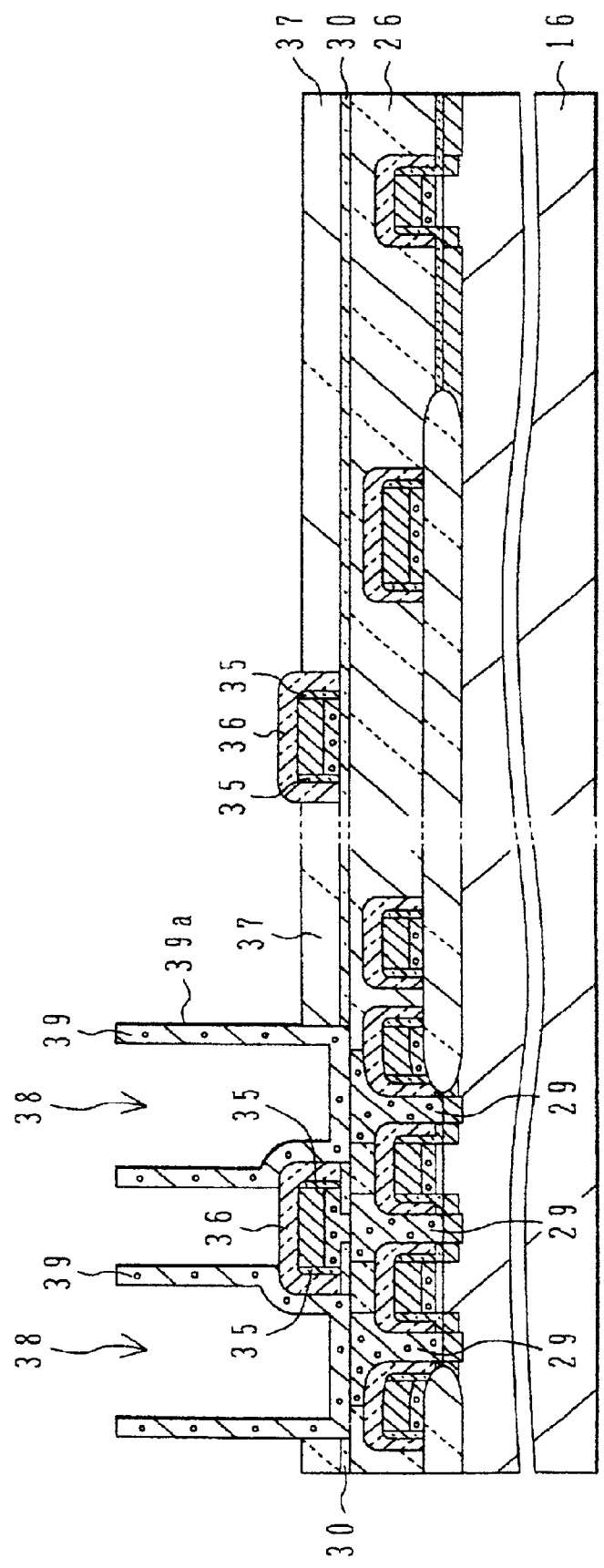

Next, as shown in FIG. 10, the BPSG film 37 is etched by hydrofluoric acid containing etchant and left for a thickness of, for example, 150 nm. In this state, a hollow cylinder type storage electrode 39 is formed.

Next, as shown in FIG. 10, a silicon nitride film is formed by CVD to a thickness of 40 nm, and thermally oxidized by 1 to 2 nm to form a capacitor insulating film 39a on the surface of the storage electrode 39 and on the BPSG film 37 (the capacitor insulating film is shown integrally with the surfaces of the storage electrode 39 and the BPSG film 37 in FIG. 10).

Figure 11:
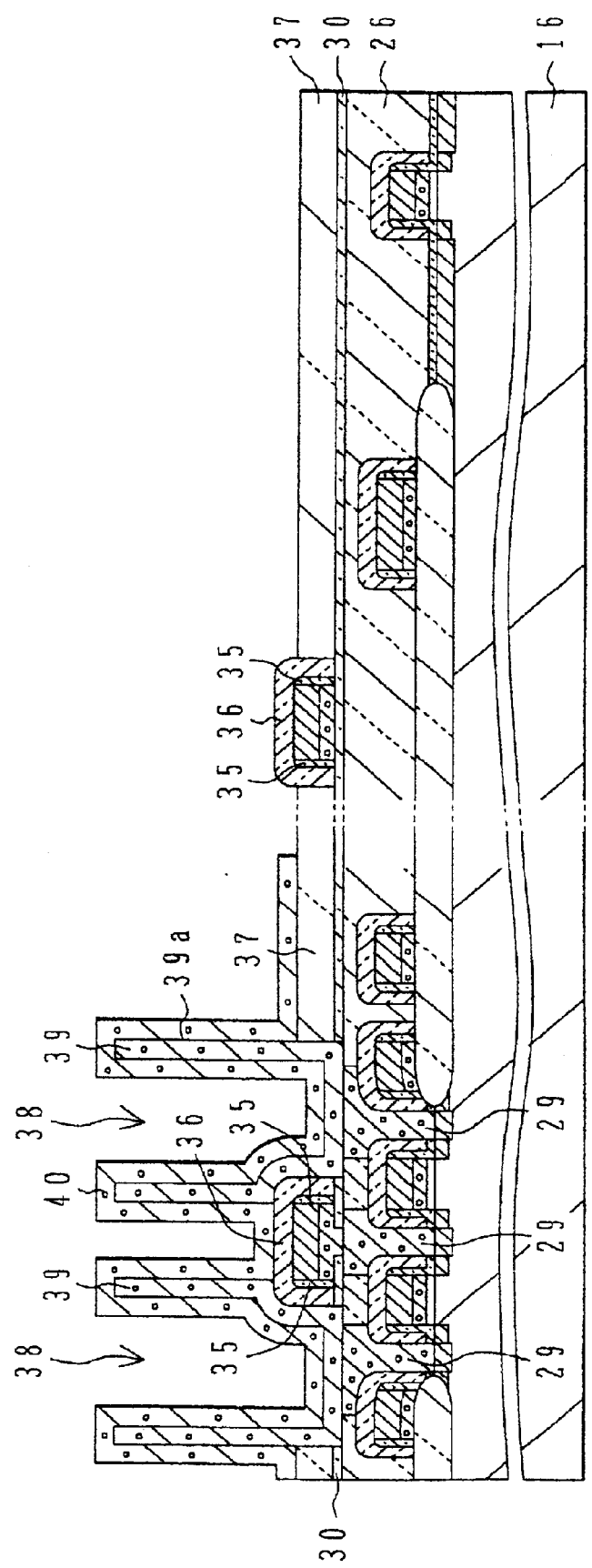

Then, as shown in FIG. 11, a phosphorous doped silicon film is formed by CVD to a thickness of 50 nm and patterned to form an opposing electrode 40 of the capacitor. At the patterning step, an unnecessary capacitor insulating film 39a is removed at the area outside of the pattern of the opposing electrode 40.

Figure 12:
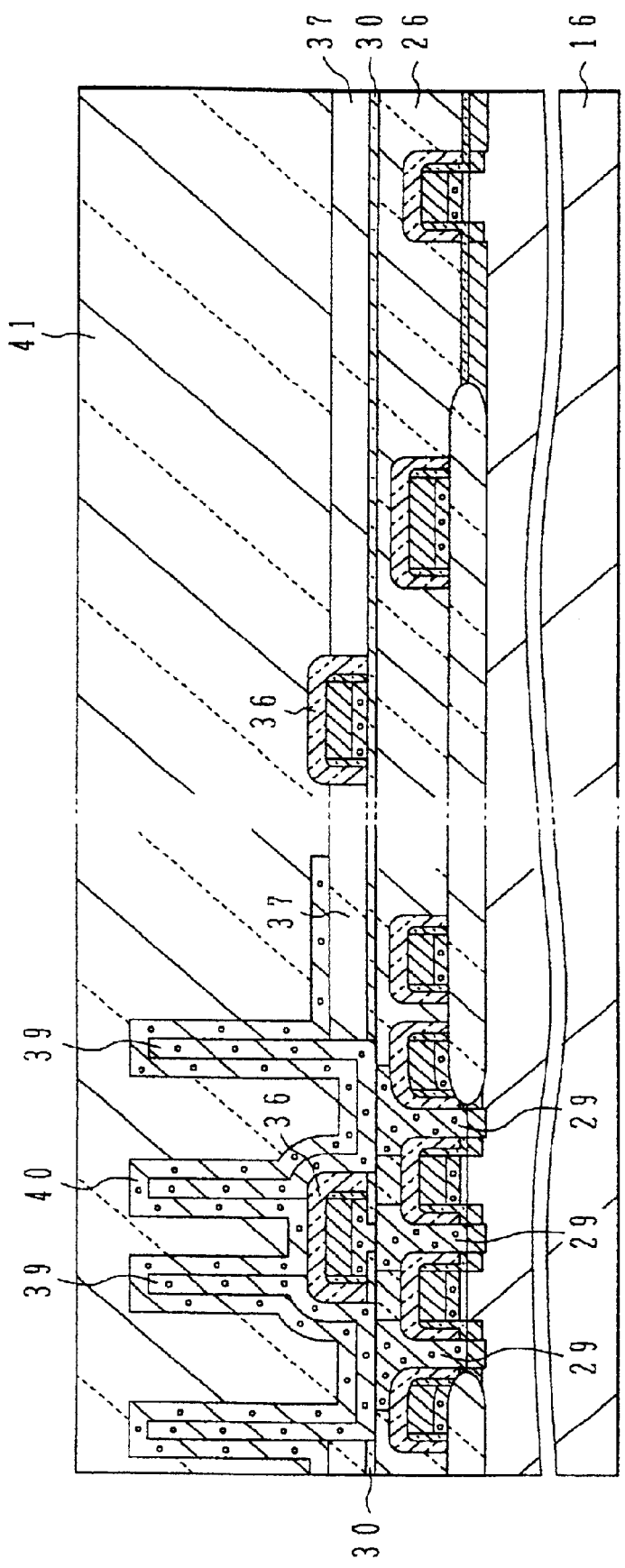

Next, as shown in FIG. 12, a BPSG film 41 is grown by CVD to a thickness of 1 μm and subjected to heat treatment at a temperature of 750 to 900° C. to planarize the surface thereof by reflow.

For further planarization, etch-back or CMP may be used or a combination thereof may be used.

With the above planarizing process, a difference of height between the memory cell area and peripheral circuit area is very small and generally the flat surface can be obtained.

Figure 13:
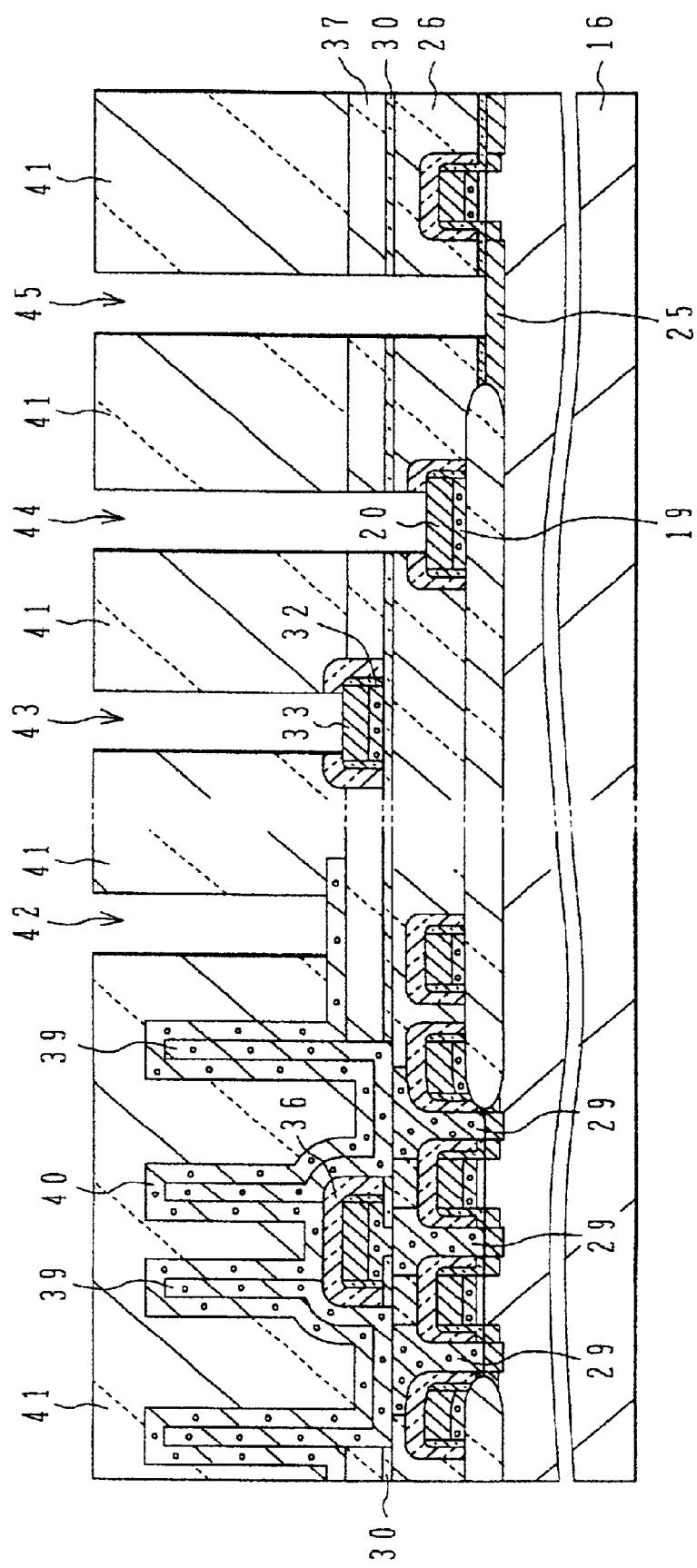

Next, as shown in FIG. 13, contact windows 42 to 45 are formed. The contact window 42 is used for contact with the opposing electrode 40, the contact hole 43 is used for contact with a wiring layer of the silicon film 32 and WSi film 33 in the peripheral circuit area, the contact hole 44 is used for contact with a wiring layer of the silicon film 19 and WSi film 20 in the peripheral circuit area, and the contact hole 45 is used for contact with the diffusion region 25 of a MOS transistor in the peripheral circuit area.

Since the BPSG film 41 is subjected to the planarizing process, its surface irregularity can be suppressed within the depth of focus of an exposure apparatus used at a resist exposure process. Size accuracy can therefore be prevented from being lowered.

It is desired to open these contact windows by a single photolithography process in order to reduce the number of processes. However, since the depths of the contact windows are very different, while the contact window 45 for the lowermost diffusion region 25 is formed, the contact window 42 for the uppermost opposing electrode 40 may penetrate through the opposing electrode and at the worst the lower wiring layer is electrically shorted.

This problem that the contact window penetrates through the conductive layer can be solved by dividing the window forming process into a plurality of processes for deep and shallow windows. For example, the process of forming the contact windows 42 to 45 is divided into two processes for the opposing electrode and for the other conductive layers, or for the opposing electrode and bit line and for the word line and diffusion region.

Figure 14:
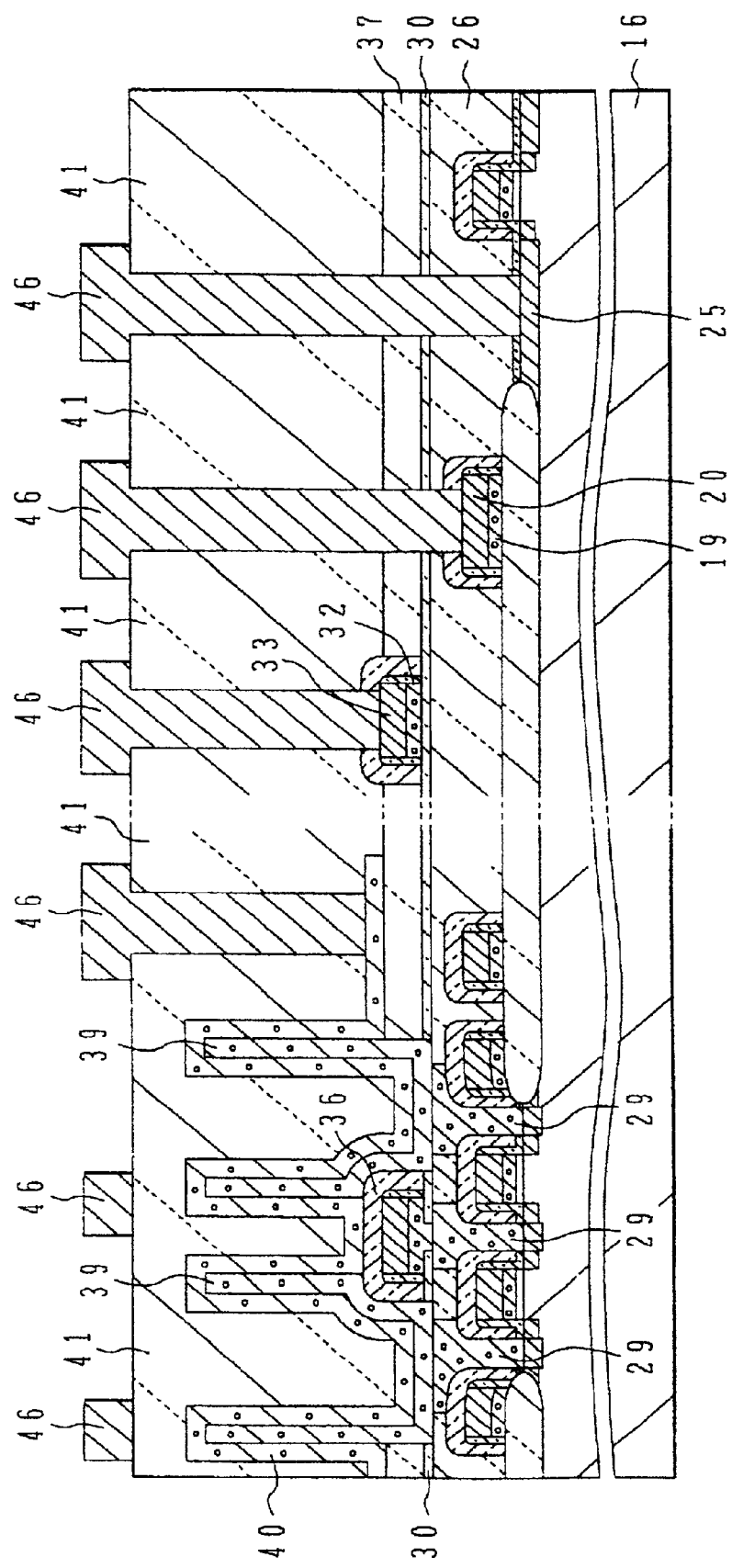

Next, as shown in FIG. 14, a titanium (Ti) film, a titanium nitride (TiN) film, and a tungsten (W) film are sequentially formed respectively by sputtering, reactive sputtering, and CVD, and patterned to form a first metal wiring layer 46.

The first metal wiring layer 46 is also disposed in the memory cell area in parallel to the word line, and mainly used for interconnections to a word decoder and a subsidiary word decoder.

Although not shown, thereafter, an interlayer insulating film is grown over the first metal wiring layer 46 and planarized by CMP.

After contact windows are formed in the interlayer insulating film over the first metal wiring layer 46, a second wiring layer is formed and patterned. The second metal wiring layer may be a lamination of a TiN film, an aluminum (Al) film, and a TiN film.

The second metal wiring layer in the memory cell area is disposed in parallel to the bit line, and mainly used for interconnections to a column decoder and a sense amplifier.

The second metal wiring layer is also used as bonding pads.

Lastly, as a passivation film, a silicon oxide film and a silicon nitride film are sequentially formed by CVD. The passivation film on the bonding pad is etched to complete a DRAM. For these processes, for example, reference may be made to U.S. Pat. No. 5,561,623 issued on Oct. 1, 1996, which is incorporated therein by reference.

In this embodiment, the polycide electrode constituting the word line, gate electrode, bit line, and wiring in the peripheral circuit area is covered with the nitride film spacer, and the oxide film is formed on the side wall of the polycide electrode under the nitride spacer. Therefore, the polycide electrode can be prevented from being separated from the substrate at later heat treatments.

Furthermore, the polycide gate electrode is completely covered with the nitride film and the oxide film is not exposed. Therefore, the oxide film is not etched when the self align contact window is formed even with misalignment and therefore the polycide electrode and upper level wiring layer are not electrically shorted.

The thicker the oxide film 22 formed on the side wall of the gate electrode, the more resistant against separation of the silicide film. However, if the oxide film 22 is formed by thermal oxidation, the substrate is oxidized at the same time and an oxide film region called a gate bird's beak thicker than the gate oxide film is formed at the opposite ends under the gate electrode. This gate bird's beak may deteriorate the characteristics of MOS transistors. Therefore, the thickness of the oxide film 22 is determined while taken this into consideration.

2nd DRAM

In the embodiment of the first DRAM, the oxide film is formed only on the side wall of the polycide electrode. As a modification of this, the structure that the oxide film completely covers the polycide electrode as shown in FIG. 1B will be described with reference to FIGS. 15A and 15B and FIGS. 16A and 16B. Similar to the first DRAM embodiment, FIGS. 15A and 15B and FIGS. 16A and 16B are schematic cross sectional views showing a memory cell area taken along line A–A' of FIG. 2 and a typical wiring structure of a peripheral circuit area.

Figure 15A:
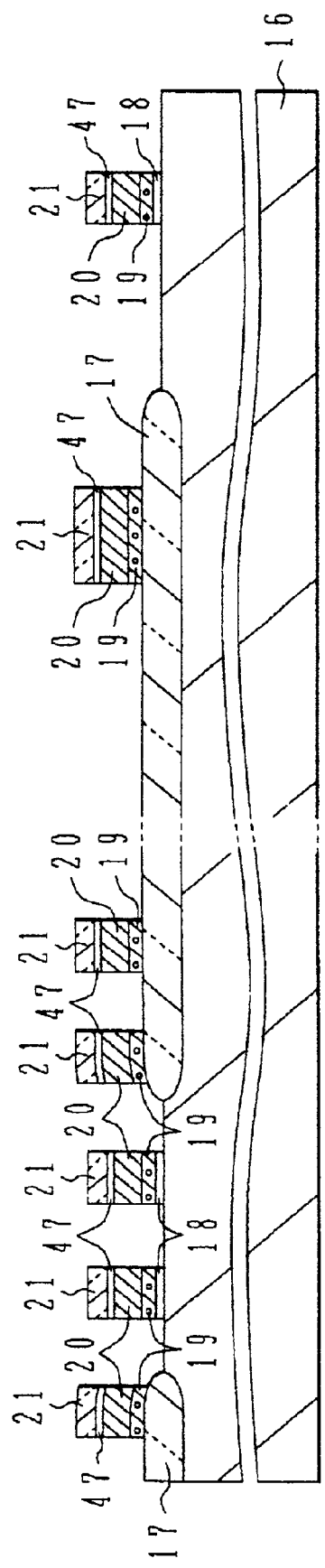
FIGS. 15A and 15B are schematic cross sectional views illustrating second DRAM manufacture processes according to another embodiment of the invention.

FIG. 15A shows an example of a gate electrode and a word line (12 in FIG. 2) to which the structure shown in FIG. 1B is applied.

A field oxide film 17 is formed on a p-type silicon substrate 16 by the same method as described with FIG. 3A.

Next, as shown in FIG. 15A, the substrate surface is oxidized to form a gate oxide film 18 to a thickness of 8 nm. On this gate oxide film 18, a phosphorous doped silicon film 19 having a thickness of 50 nm and a WSi film 20 having a thickness of 50 nm are sequentially deposited by CVD.

Then, an oxide film 47 is formed to a thickness of 3 to 50 nm. This film may be formed either by thermal oxidation or CVD. The thermal oxidation is more preferable because a structure more resistant to separation or peel-off can be obtained. If the oxide film is formed by thermal oxidation, the polycide film is thinned. In this case, therefore, it is also effective to use a method of forming a thin oxide film by thermal oxidation and thereafter forming an oxide film by CVD to obtain a desired oxide thickness.

After a silicon nitride film 21 is formed by CVD to a thickness of 80 nm, the lamination of these films is patterned into a gate electrode and a wiring layer.

As different from the first DRAM, the lamination is formed by the silicon film 19, WSi film 20, oxide film 47, and silicon nitride film 21.

Figure 15B:
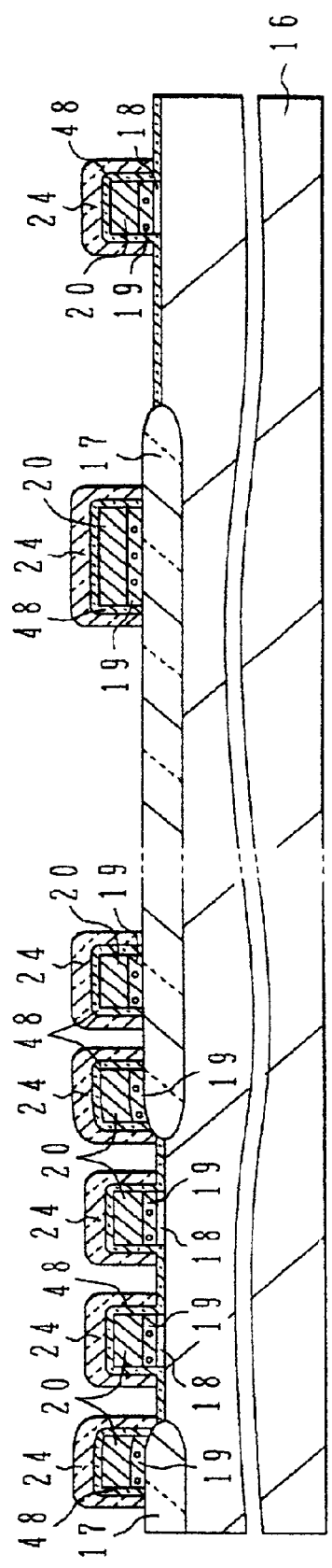

Next, as shown in FIG. 15B, a heat treatment is performed to grow a thermal oxide film to 2 to 10 nm thick. This oxidation forms an oxide film on the side wall of the polycide structure of the silicon film 19 and WSi film 20, the oxide film becoming in unison with the oxide film 47 to form an oxide film region 48.

Then, similar to the first DRAM, by using the gate electrode as a mask, n-type impurity ions, phosphorous, are doped at a dose of $1\times10^{13}$ cm$^{-2}$ over the whole surface of the substrate. An impurity doped region 23 corresponding to an n$^-$-type region of an LDD structure is therefore formed in the n-channel MOS transistor region.

Then, a silicon nitride film is formed by CVD to a thickness of 50 to 150 nm and anisotropically etched to form a nitride film region 24 covering the oxide film region 48.

Thereafter, by using the similar processes to the first DRAM, the second DRAM is completed.

In this embodiment, the oxide film is formed not only on the side walls of the silicon film 19 and WSi film 20 but also on the upper surface of the WSi film 20 so that the polycide electrode does not directly contact the silicon nitride film. Therefore, a structure more resistant to separation or peel-off of the WSi film can be obtained.

3rd DRAM

Figure 16A:
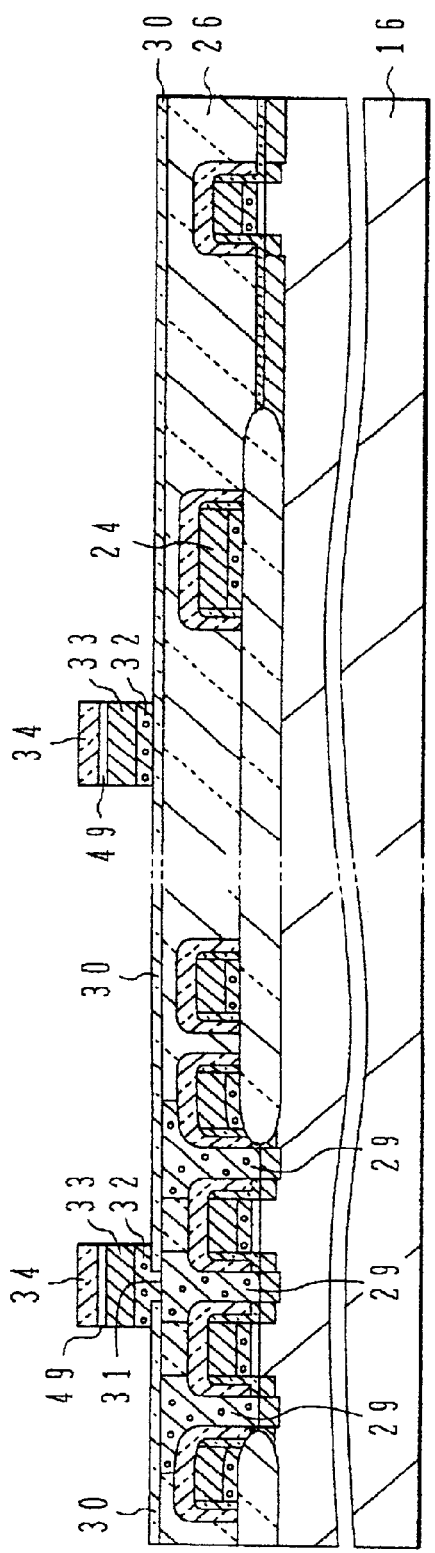
FIGS. 16A and 16B are schematic cross sectional views illustrating third DRAM manufacture processes according to another embodiment of the invention.
Figure 16B:
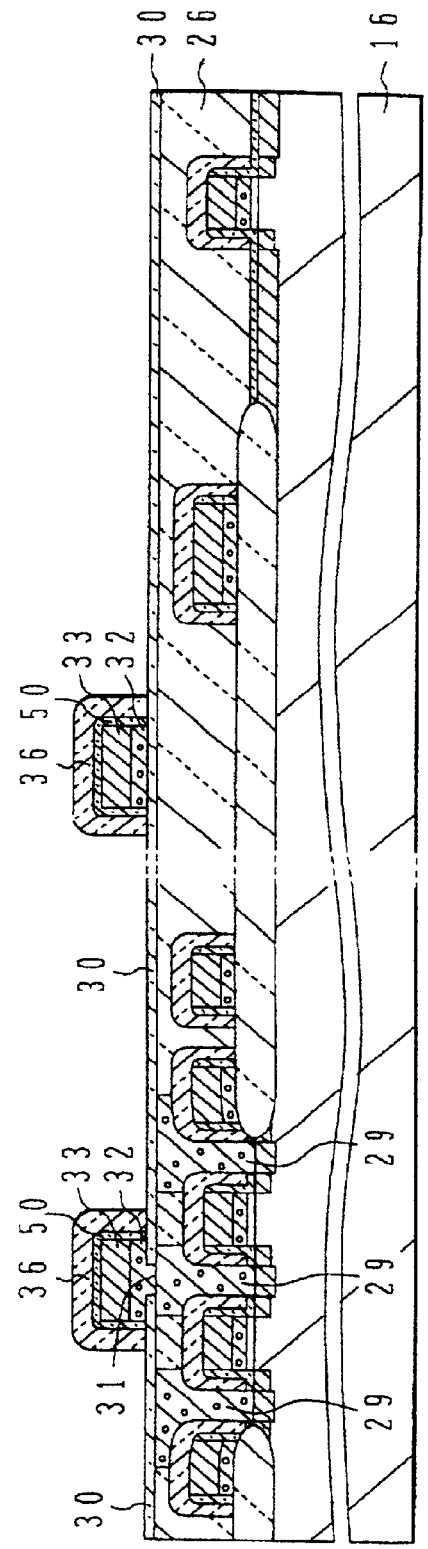

FIGS. 16A and 16B show a bit line (13 in FIG. 2) in the memory cell area to which the structure shown in FIG. 1B is applied.

The processes similar to the embodiment of the first DRAM are performed up to that shown in FIG. 5B to form a silicon oxide film 30 on a planarized BPSG film 26.

As shown in FIG. 16A, a resist pattern having an opening at the bit line connection area is formed. By using the resist pattern as a mask, the oxide film 30 is etched to form a contact window 31 which exposes part of the upper surface of the silicon plug 29. Thereafter, the resist pattern is removed.

Successively, a phosphorous doped silicon film 32 is formed to a thickness of 30 nm, a WSi film 33 is formed by CVD to a thickness of 50 nm, and thereafter an oxide film 49 of 3 to 50 nm is formed. The structure of these films and manufacture methods thereof are the same as those previously described with word lines of the 2nd DRAM.

Next, after a silicon nitride film 21 is formed by CVD to a thickness of 80 nm, the lamination of these films is patterned to form bit lines and a wiring layer.

As shown in FIG. 16B, an oxide film is grown to a thickness of 2 to 10 nm by thermal oxidation. The oxide film is therefore formed on the side wall of the polycide structure of the silicon film 32 and WSi film 33. An oxide film region 50 in unison with the oxide film 49 is therefore formed.

Next, a silicon nitride film is formed by CVD to a thickness of 50 to 150 nm and anisotropically etched by RIE to form a nitride film region 36 covering the oxide film region 50.

Thereafter, the processes similar to the first DRAM are performed to complete a DRAM.

Also in this embodiment, similar to the word line, the oxide film is formed not only on the side walls of the silicon film 32 and WSi film 33 but also on the upper surface of the WSi film 33, so that the polycide electrode does not directly contact the silicon nitride film. A structure more resistant to separation of the WSi film can therefore be provided.

In the above description, the polycide structure completely covered with the oxide film and the polycide structure partially covered with the oxide film are used for the word line and bit line in the memory cell area. Obviously, such polycide structures may be used singularly or in combination for both the word and bit lines.

Also in this embodiment, as the oxide film covering the gate electrode is made thicker, the structure becomes more resistant to separation of the silicide film. However, if the oxide film on the side wall of the gate electrode is formed by thermal oxidation, the oxide film cannot be made too thick because the MOS transistor characteristics may be deteriorated by the gate oxide bird's beak as described earlier. The oxide film on the upper surface of the gate electrode may be made thicker than that on the side wall of the gate electrode to provide the structure more resistant to separation without deteriorating the MOS transistor characteristics.

4th DRAM

A manufacture method according to another embodiment of the invention will be described with reference to FIGS. 17A to 23. Similar to the above embodiments, FIGS. 17A to 23 are schematic cross sectional views showing a memory cell area taken along line A–A' of FIG. 2 and a typical wiring structure of a peripheral circuit area.

The processes similar to the first RAM are performed up to the process illustrated in FIG. 4B. With these processes, polycide electrodes constituting the word lines and gate electrodes, nitride film regions, and the like are formed.

As shown in FIG. 17A, a BPSG film 26 is grown to a thickness of 100 to 200 nm by CVD, and thereafter, heat treatment is performed at a temperature of 750 to 900° C. to planarize the surface of the BPSG film 26 through reflow.

Etch-back or CMP may be used to further planarize the surface, similar to the first embodiment.

On the planarized BPSG film 26, a silicon nitride film 51 is grown by CVD to a thickness of 10 to 50 nm.

As shown in FIG. 17B, a resist pattern is formed having an opening which exposes the source/drain regions of a MOS transistor in the memory cell area. By using this resist pattern as a mask, the nitride film 51, BPSG film 26, and oxide film 22 are sequentially etched to expose the substrate surface and form a contact window 27.

Etching the nitride film 51 is performed by RIE using $CF_4$ gas. When the surface of the BPSG film 26 is exposed, the gas is changed to mixed gas of $C_4F_8$ and CO to etch the BPSG film by RIE under the conditions of a higher etching selection ratio of oxide film relative to the nitride film so that the nitride film area 24 is not etched. The etching ratio to the nitride film is preferably 10 or higher.

Also in this embodiment, the contact hole 27 is defined by a self alignment manner because of the nitride film spacer 24 and the polycide gate electrode is completely covered with the nitride film without exposing the oxide film. Therefore, the oxide film inside the spacer is not etched and removed even if there is misalignment of the opening of the resist pattern. Therefore, the gate electrode and contact electrode will not be electrically shorted as in the case of conventional techniques described with FIGS. 35A to 37.

Similar to the first DRAM, after the resist pattern is removed, by using the BPSG film 26 and nitride film region 24 as a mask, n-type impurity ions, phosphorus, are implanted at a dose of $3\times10^{13}$ cm$^{-2}$ into the silicon substrate exposed in the contact window 27 to thereby form an n-type diffusion region 28.

Next, as shown in FIG. 18A, a phosphorus doped silicon film is formed by CVD over the whole surface of the substrate, and a plug 29 of the silicon film is left in the contact hole 27 by etch-back or CMP.

The plug 29 of silicon may be formed by selective CVD without using etch-back or CMP.

A silicon oxide film 30 is then formed by CVD to a thickness of 30 to 100 nm.

As shown in FIG. 18B, a resist pattern having an opening at a bit line connection area is formed. By using this resist pattern as a mask, the oxide film 30 is etched to form a contact window 31 exposing part of the upper surface of the silicon plug 29. Thereafter, the resist pattern is removed.

Next, a phosphorus doped silicon film 32 of 30 nm thick, a WSi film 33 of 50 nm thick, and a silicon nitride film 34 of 80 nm thick are sequentially formed by CVD.

The lamination of these films is patterned to have a desired wiring pattern by well know photolithography. Another nitride film is deposited and subjected to RIE to leave a nitride film 36 (see FIG. 19). The polycide electrode of this lamination corresponds to a bit line (13 in FIG. 2) in the memory cell area, and to a wiring layer other than the bit line in the peripheral circuit area.

Figure 19:
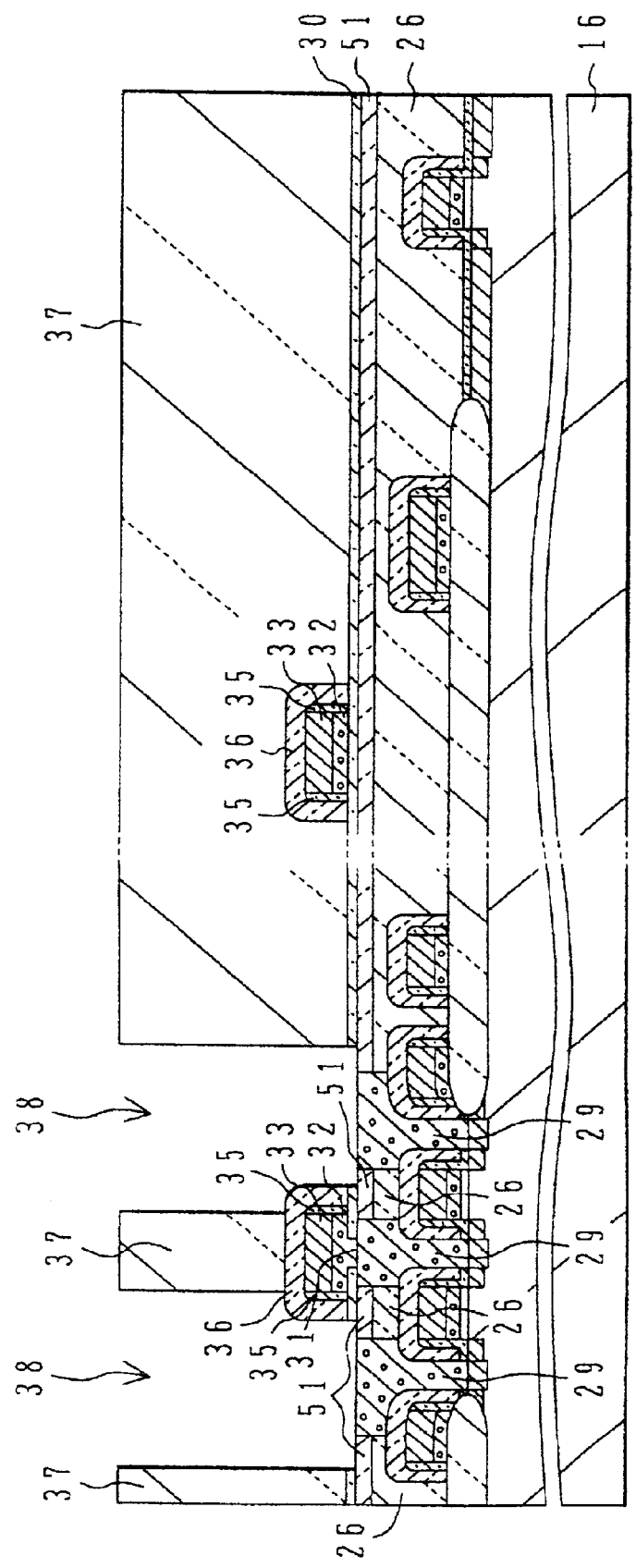

Next, as shown in FIG. 19, a BPSG film 37 is grown to a thickness of 500 nm by CVD, and thereafter, heat treatment is performed at a temperature of 750 to 900° C. to planarize the surface of the BPSG film 37 through reflow.

Etch-back or CMP may be used to further planarize the surface, or a combination of these processes may be used for planarization.

Next, a resist pattern having an opening exposing the capacitor connection area is formed. By using this resist pattern as a mask, the BPSG Film 37 and oxide film 30 exposed in the opening are sequentially etched by RIE using, for example, mixed gas of $C_4F_4$ and CO to thereby form a contact window 38 exposing the upper surface of the silicon plug 29.

In this case, since the side surface of the polycide gate electrode is completely covered with the nitride film region 36, the oxide film is not etched and the bit line and storage electrode are not electrically shorted.

In the embodiment of the first DRAM, as shown in FIG. 8, the BPSG film 26 is formed under the oxide film 30. Therefore, when the contact window 38 is formed by etching the BPSG film 37 and oxide film 30, there is a danger of etching the BPSG film 26 and forming a trench at the side of the plug 29 in the capacitor connection area.

Then, the shape and area of the storage electrode formed on the trench change and so the capacitance changes. There is therefore a possibility that stable characteristics cannot be obtained.

In contrast, in this embodiment, the nitride film 51 is formed under the oxide film 30. This nitride film 51 functions as an etching stopper at the connection area of the storage electrode when the BPSG film 37 and oxide film 30 are etched. Therefore, no trench is formed at the side of the plug 29 in the capacitor connection area. It is therefore possible to obtain stable capacitance and improve DRAM manufacture yield.

Figure 20:
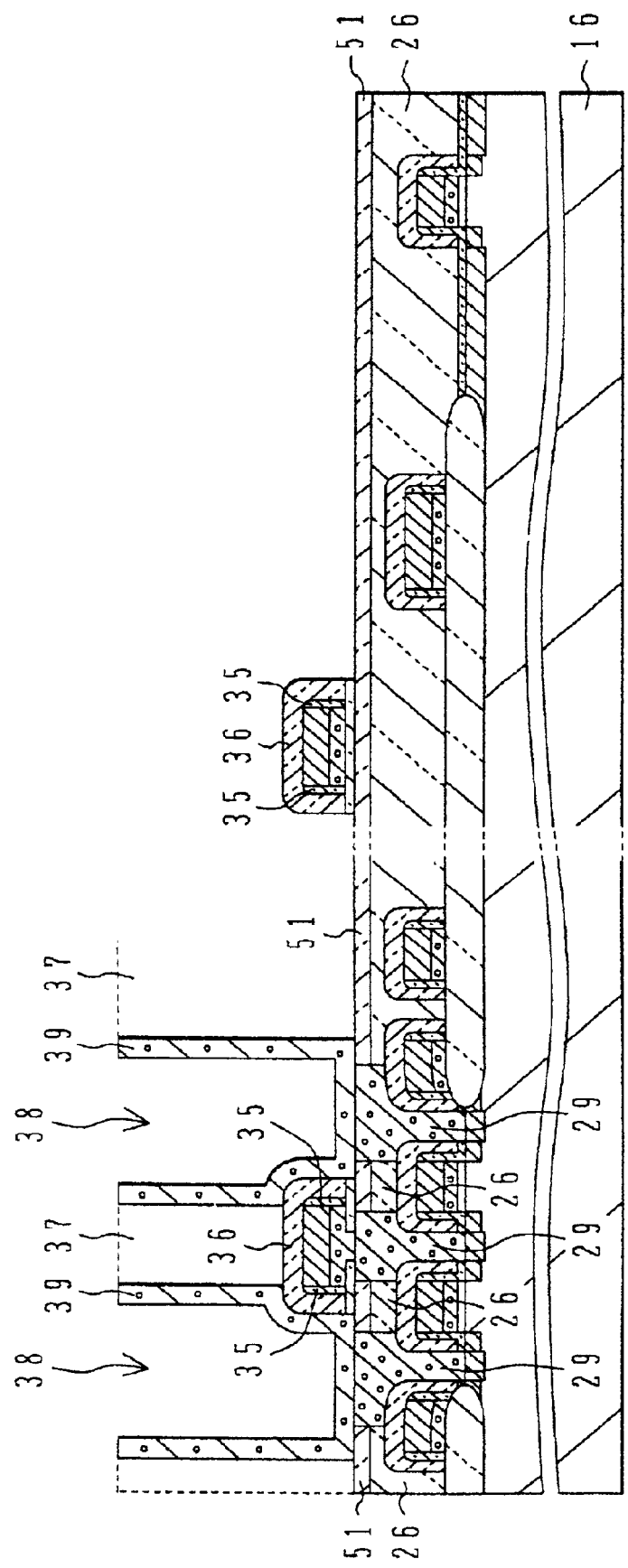

Next, as shown in FIG. 20, after the resist pattern is removed, a phosphorous doped silicon film is formed by CVD to a thickness of 50 nm. The silicon film on the top flat surface is removed by polishing, for example chemical mechanical polishing (CMP), or etch-back and a silicon film 39 is left at the side wall and bottom of the contact window 38.

Then, the BPSG film 37 is completely etched by using hydrofluoric acid containing etchant and by using the nitride film 51 as an etching stopper, to thereby form a hollow cylindrical storage electrode 39.

In the embodiment of the first DRAM, as shown in FIG. 9, after the silicon film 39 is left only at the side wall and bottom of the contact window 38, the BPSG film is etched to a predetermined depth by hydrofluoric acid containing etchant as shown in FIG. 10 to thereby form the hollow cylindrical storage electrode 39.

In this embodiment, by using the nitride film 51 as an etching stopper, the BPSG film 37 outside the silicon film 39 can be etched completely by hydrofluoric acid containing etchant. Therefore, variation of etching amounts of the BPSG film 37 is small so that the outer area of the cylinder type storage electrode can be maintained constant. It is therefore possible to manufacture stable DRAM cells with less variation of capacitance values.

Figure 21:
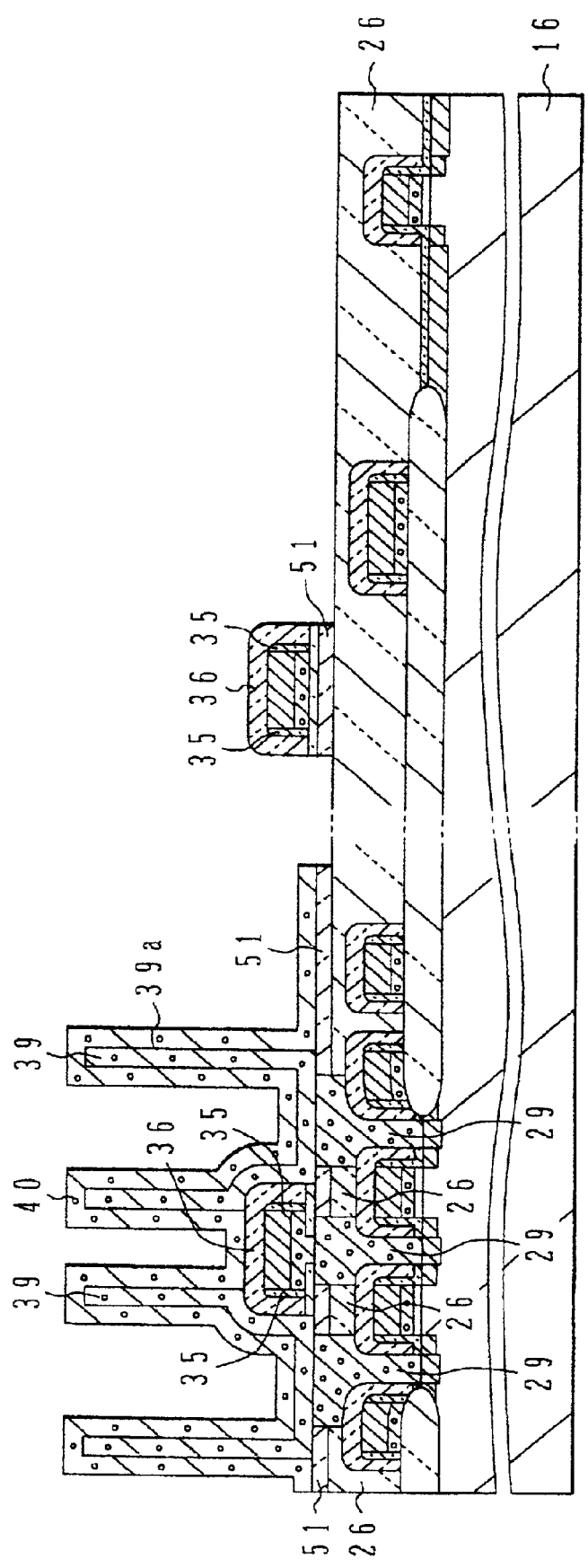

As shown in FIG. 21, a silicon nitride film is formed by CVD to a thickness of 40 nm, and thermally oxidized by 1 to 2 nm to thereby form a capacitor insulating film 39a on the surface of the storage electrode 39 (the capacitor insulating film is shown integrally with the surface of the storage electrode 39 in FIG. 21).

Next, the phosphorous doped silicon film is formed by CVD to a thickness of 50 nm and patterned to form an opposing electrode 40 of the capacitor. At the patterning step, an unnecessary capacitor insulating film and silicon nitride film 51 are etched at the same time at the area outside of the pattern of the opposing electrode 40.

In this state, although the silicon nitride film 51 may be left unetched, it is rather preferable to remove it from the following reason. If the silicon nitride film is left at the peripheral circuit area, the succeeding process of forming a contact window for the diffusion region in the peripheral circuit area becomes complicated because both the oxide film and silicon nitride film should be etched. In addition, because of a difference of etching characteristics between silicon oxide film and silicon nitride film, the silicon nitride film in the contact window may form an overhang or eaves which may result in breakage of a metal wiring layer formed in the contact window.

At the same time when the silicon nitride film 51 is etched, the silicon nitride film region 36 of the wiring layer in the peripheral circuit area is etched. It is therefore preferable that the silicon nitride film 34 (see FIG. 18B) on the WSi film 33 constituting the silicon nitride film region 36 is set thicker than the silicon nitride film 51.

The succeeding processes are similar to the embodiment of the first DRAM, which processes form interlayer insulating film, contact windows and metal wiring layers to complete a DRAM.

As compared to the embodiment of the first DRAM, this embodiment uses the nitride film 51 serving as an etching stopper layer. The area of the storage electrode can be maintained constant during the processes of forming the storage electrode and its contact window. Therefore, stable capacitance can be obtained and the DRAM manufacture yield can be improved.

As another advantageous effect, a stable process of forming a contact window for the bit line can be expected. This will be clarified with reference to FIGS. 22 and 23.

Figure 22:
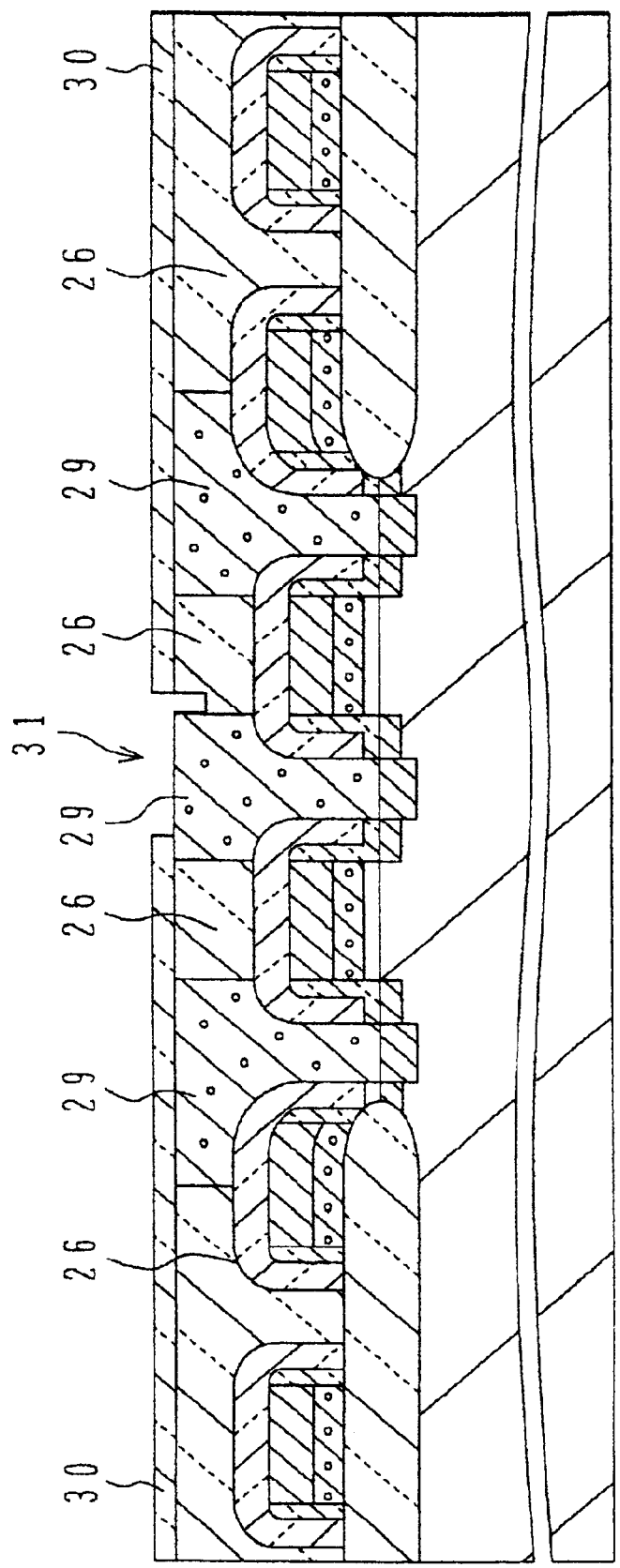
Figure 23:
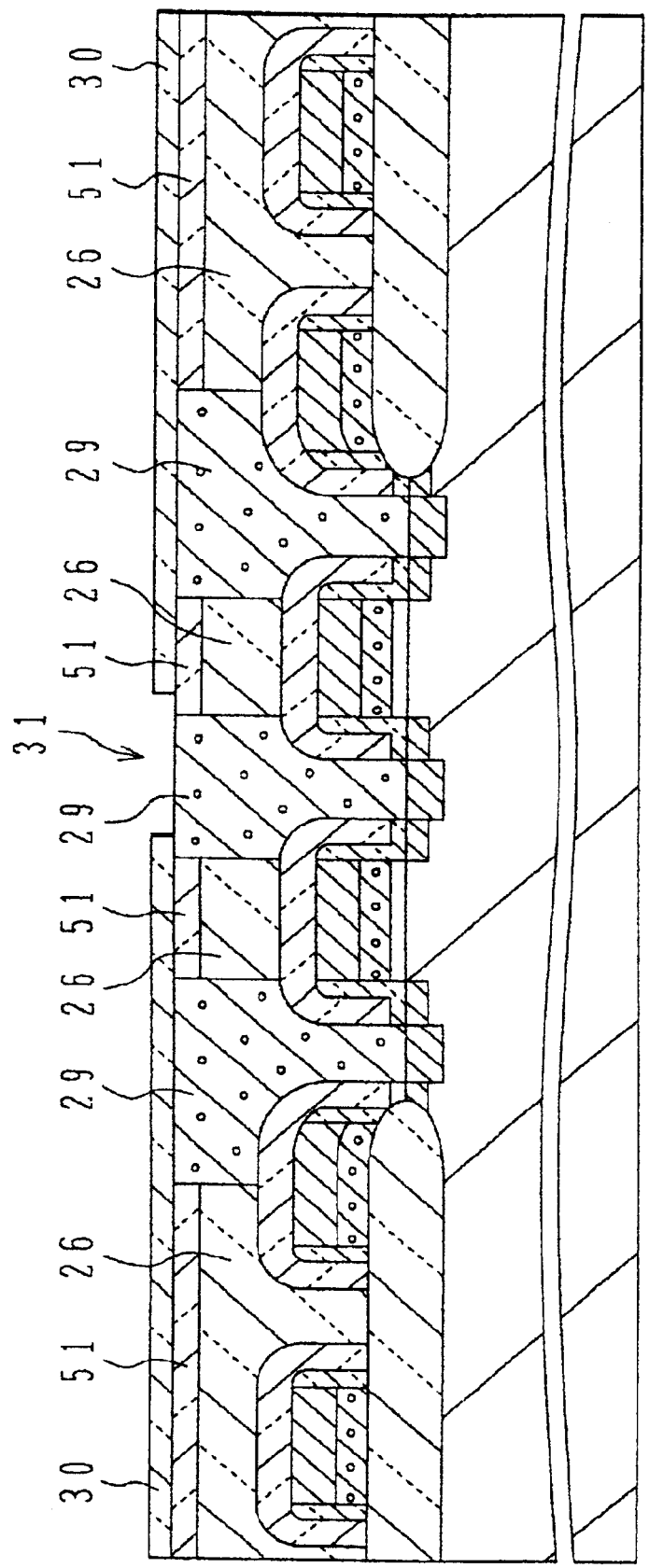

FIGS. 22 and 23 are schematic cross sectional views of the memory cell area taken along line A–A' of FIG. 1A, illustrating a displaced contact window 31 shown in FIG. 18B. FIG. 22 shows no silicon nitride film 51 under the oxide film 30 and corresponds to the embodiment of the first DRAM, and FIG. 23 has the silicon nitride film 51 under the oxide film 30 and corresponds to the embodiment of the fourth DRAM.

With the processes of the embodiment of the first DRAM, as shown in FIG. 22 if the contact window 31 is formed at a displaced area, the BPSG film 26 can be etched at the same time when the oxide film 30 is etched and a trench is formed at the side of the silicon plug 29.

This trench may break the bit line formed on the higher level layer or may be left as a void without being filled, or conversely the wiring layer left in the trench may electrically short adjacent plugs 29. There is therefore a danger of some adverse effects on the device.

In contrast, in this embodiment, as shown in FIG. 23 even if the contact window 31 is formed at a displaced area, the nitride film 51 functions as the etching stopper. Therefore, there is no danger of etching the BPSG film 26 and no trench is formed at the side of the silicon plug 29, dispensing with the above adverse effects.

By positively using this nitride film stopper 51, it becomes possible to make the size of the contact widow 31 larger than the silicon plug 29 so that a margin of a process of forming a contact window can be increased.

5th DRAM

A fifth DRAM according to another embodiment of the invention will be described with reference to the schematic cross sectional views of FIGS. 24 to 28. Similar to the embodiments of the first and second DRAMs, FIGS. 24 to 28 are schematic cross sectional views showing a memory cell area taken along line A–A' of FIG. 2 and a typical wiring structure of a peripheral circuit area.

The processes similar to the embodiment of the first RAM are performed up to the process illustrated in FIG. 6B. With these processes, the polycide electrodes 32, 33 and silicon nitride film regions 36, and the like are formed above the word lines and MOS transistors of the peripheral circuit area, to serve as the bit lines and wiring layers in the peripheral circuit area.

Figure 24:
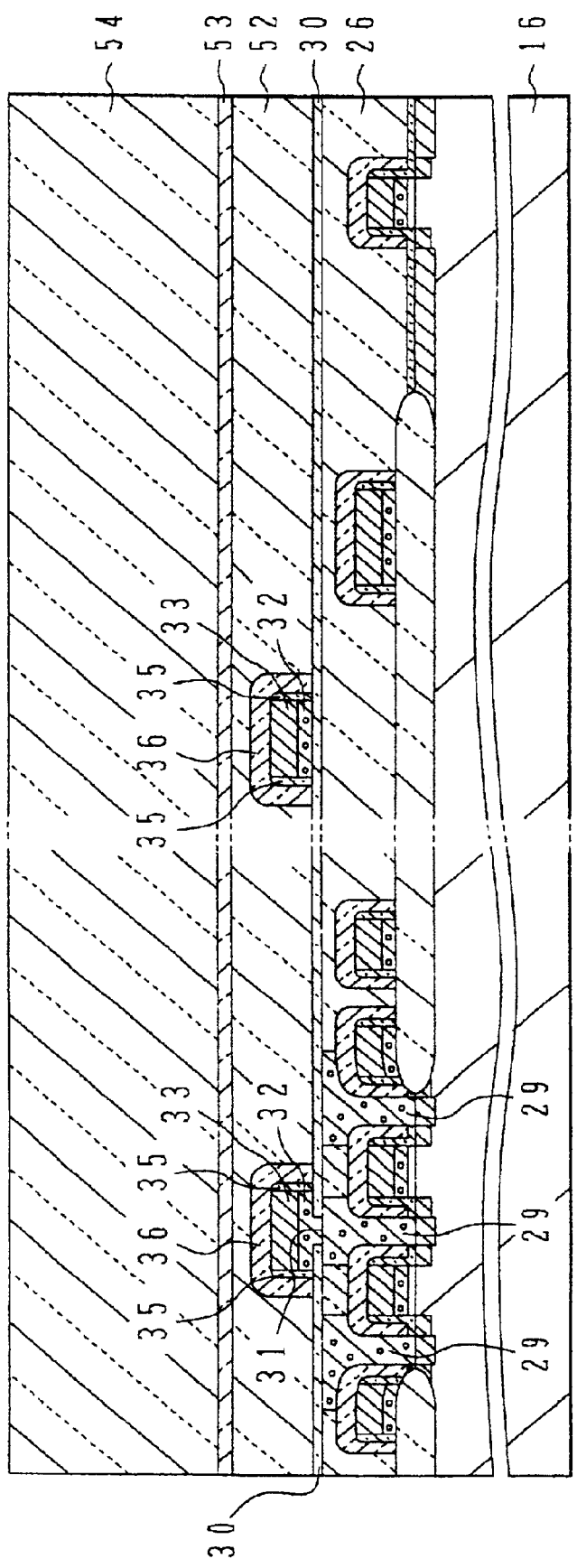
FIGS. 24 to 28 are schematic cross sectional views illustrating fifth DRAM manufacture processes according to another embodiment of the invention.

As shown in FIG. 24, a BPSG film 52 is grown by CVD over the whole surface of the substrate, and thereafter, heat treatment is performed at a temperature of 750 to 900° C. to planarize the surface of the BPSG film 52 through reflow.

Etch-back or CMP may be used to further planarize the surface, or the combination of these processes may be used.

Next, a silicon nitride film 53 and a BPSG film 54 are sequentially grown by CVD.

The total thickness of the BPSG films 52 and 54 is set to 500 nm, and that of the silicon nitride film 53 is set to 10 to 50 nm.

The thickness of the BPSG film 52 is so set that it can be planarized. The thickness of the BPSG film 54 defines the area of the outer surface of the cylinder type storage electrode directly related to the capacitance. Therefore, the thickness of the BPSG film 54 is determined from a necessary capacitance. The thickness ratio and total thickness of the BPSG films 52 and 54 are therefore set in accordance with the above two conditions.

Figure 25:
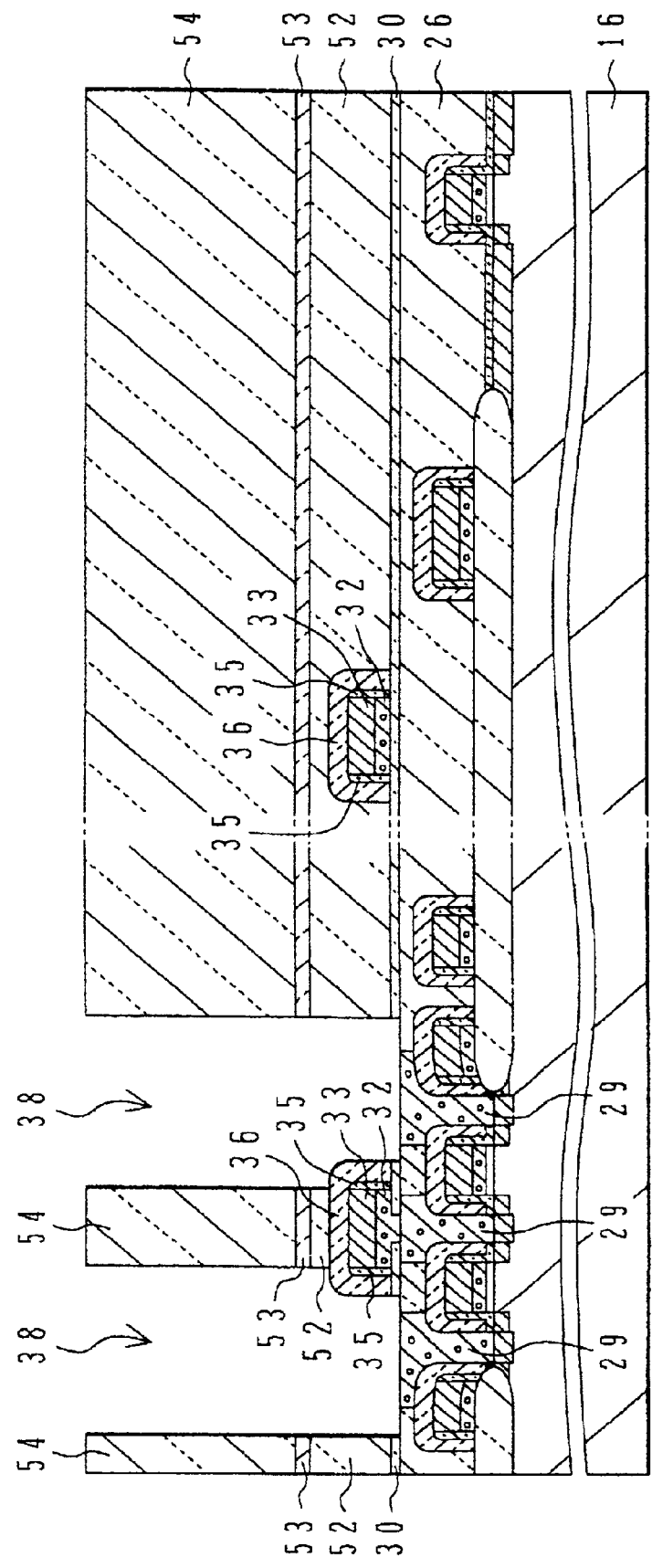

A resist pattern is formed having an opening which exposes the capacitor connection area. By using this resist pattern as a mask, the BPSG film 54 exposed in the opening of the resist pattern is etched by RIE using mixed gas of $C_4F_8$ and CO, the nitride film 53 is next etched by RIE using $CF_4$ gas, and then the BPSG film 52 and oxide film 30 are sequentially etched by RIE using mixed gas of $C_4F_8$ and CO, as shown in FIG. 25, to thereby form a contact window 38 exposing the upper surface of the silicon plug 29.

Figure 26:
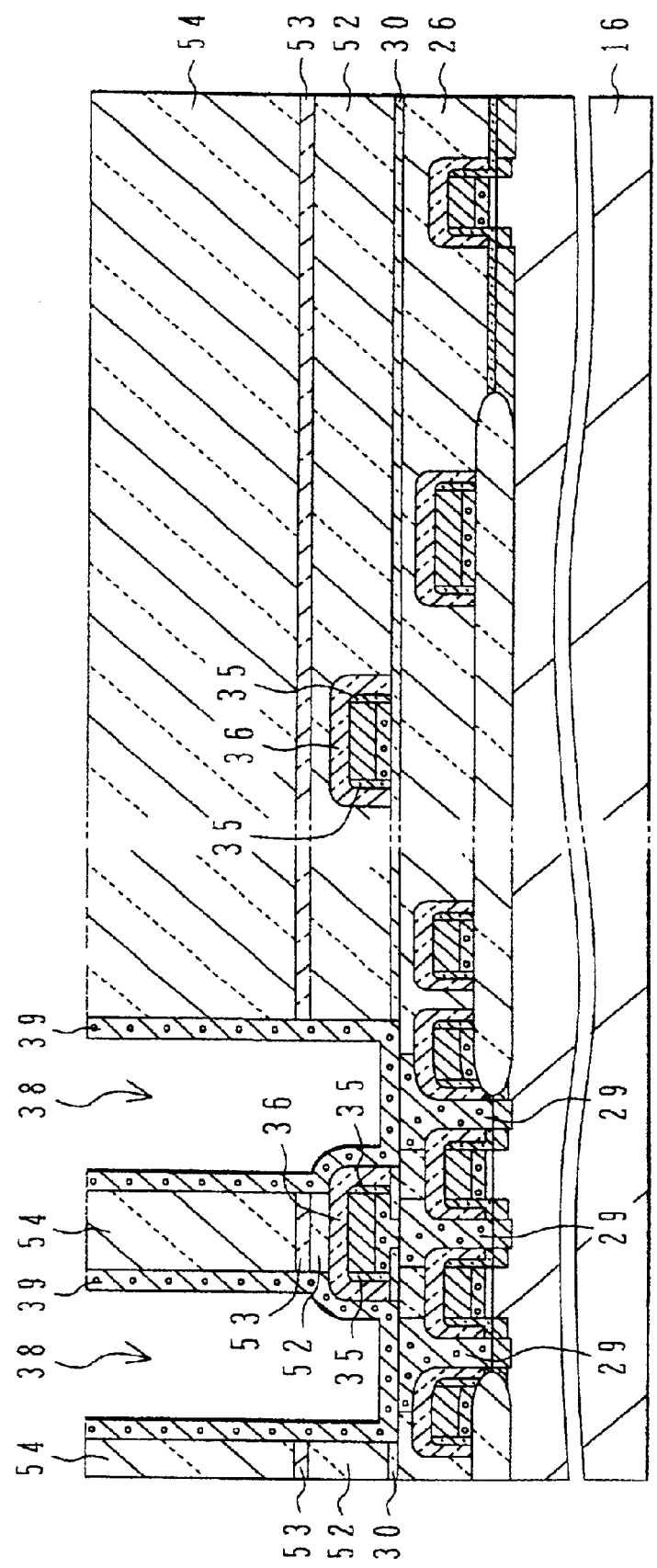

As shown in FIG. 26, after the resist film is removed, a phosphorus doped silicon film is formed by CVD to a thickness of 50 nm over the whole surface of the substrate, and by using etch-back or CMP, a silicon film 39 is left only at the bottom and side wall of he contact window 38.

Figure 27:
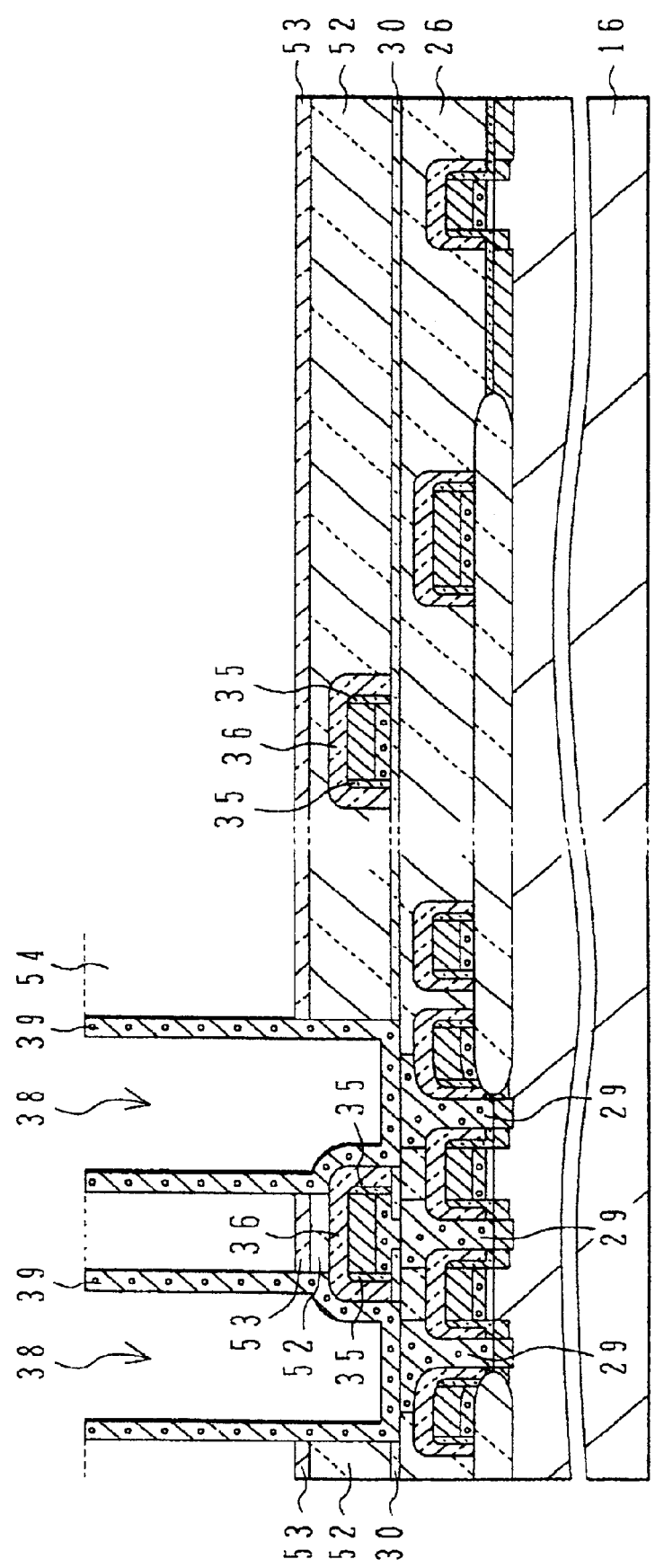

As shown in FIG. 27, the BPSG film 54 outside the silicon film 39 is completely etched by using hydrofluoric acid containing etchant. Since the nitride film 53 functions as the etching stopper, only the BPSG film 54 can be completely removed. With this process, a hollow cylindrical storage electrode 39 can be formed.

Also in this embodiment, similar to the embodiment of the fourth DRAM, the BPSG film 54 outside the cylinder type storage electrode 39 can be completely removed. Therefore, the outer area of the cylinder type storage electrode can be maintained constant. It is therefore possible to manufacture stable DRAM cells with less variation of capacitance values.

Figure 28:
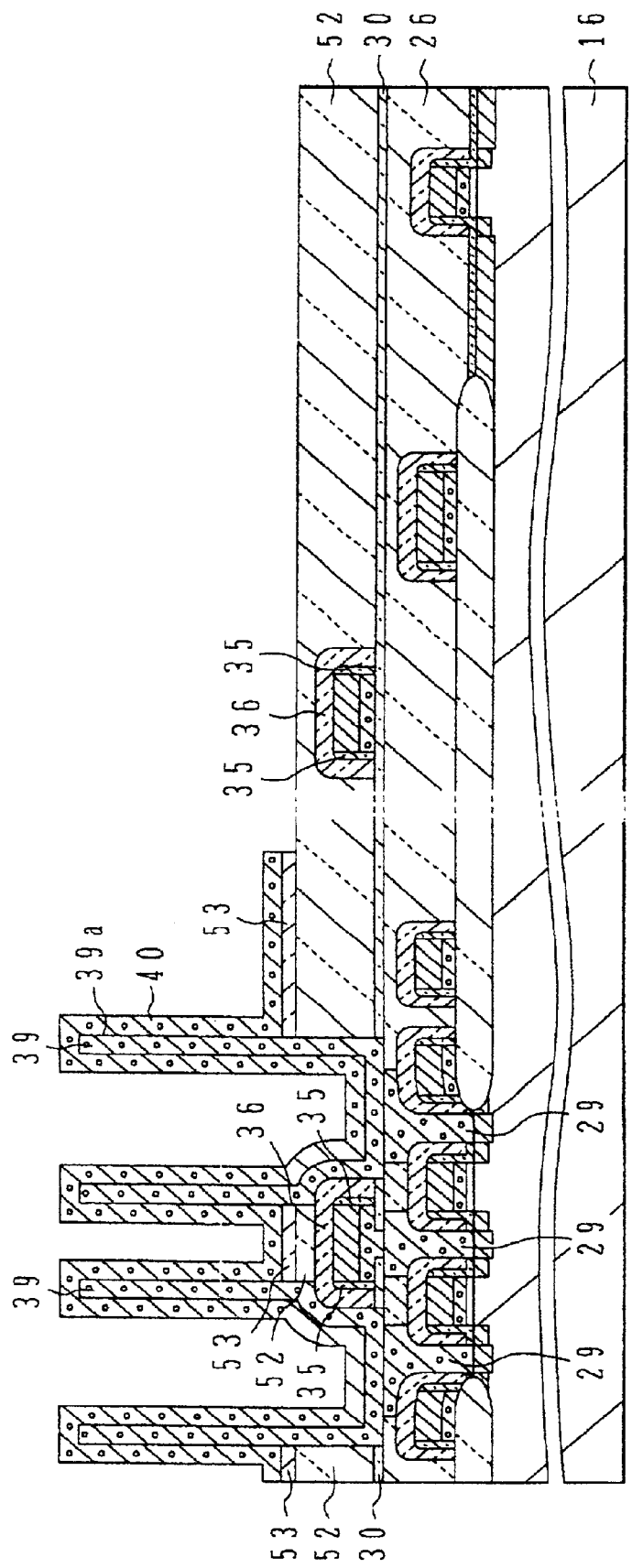

As shown in FIG. 28, a silicon nitride film is formed by CVD to a thickness of 40 nm, and thermally oxidized by 1 to 2 nm to thereby form a capacitor insulating film on the surface of the storage electrode 39a (the capacitor insulating film is shown integrally with the surface of the storage electrode 39 in FIG. 28).

Next, the phosphorous doped silicon film is formed by CVD to a thickness of 50 nm and patterned to form an opposing electrode 40 of the capacitor. Following the patterning of the electrode 40, an unnecessary capacitor insulating film and silicon nitride film 53 are etched at the area outside of the pattern of the opposing electrode 40.

In this case, similar to the embodiment of the fourth DRAM, although the silicon nitride film 53 may be left unetched, it is rather preferable to remove it in the peripheral circuit area from the following reason. If the silicon nitride film is left at the peripheral circuit area, the succeeding process of forming a contact window for the diffusion region in the peripheral circuit area becomes complicated because both the oxide film and silicon nitride film should be etched. In addition, because of a difference of etching characteristics between silicon oxide and silicon nitride, the silicon nitride film in the contact window may form an overhang or eaves which may result in breakage of a metal wiring layer formed in the contact window.

The succeeding processes are similar to the embodiment of the first DRAM, which processes form interlayer insulating layer, contact windows and metal wiring layers to complete a DRAM.

In this embodiment, only the BPSG film 54 outside of the cylinder type storage electrode 39 can be completely removed. It is therefore possible to manufacture stable DRAM cells with less variation of capacitance values.

In the embodiment of the first DRAM, after the capacitor opposing electrode 40 is formed as shown in FIG. 11, planarization is performed by using the insulating film as shown in FIG. 12. In this embodiment of the fifth DRAM, it is obvious that planarization at the later process becomes easier because a difference of height between the memory cell area and peripheral circuit area is reduced.

In this embodiment, therefore, process design can be carried out by considering both the effects that stable capacitance can be obtained and that planarization becomes easy because of a small difference of height between the memory cell area and peripheral circuit area. It is therefore possible to manufacture DRAMs of stable characteristics.

The nitride film 53 is etched at the same time when the opposing electrode 40 is patterned. Therefore, similar to the embodiment of the fourth DRAM, problems to be caused by the silicon nitride film in the peripheral circuit area can be eliminated.

As different from the embodiment of the fourth DRAM, the BPSG film 52 exists under the silicon nitride film 53 so that the BPSG film 52 can be etched by using the silicon nitride film 53 as the etching stopper and there is no fear of etching the silicon nitride film region 36 of the wiring layer in the peripheral circuit area corresponding to the bit line in the memory cell area.

6th DRAM

The manufacture method of a sixth DRAM according to another embodiment of the invention will be described with reference to FIGS. 29 and 30. This embodiment pertains to a method of forming the contact windows 42 to 45 for the first metal wiring layer of the embodiment of the fourth DRAM shown in FIG. 21, followed by the processes as shown in FIGS. 12 and 13.

Figure 29:
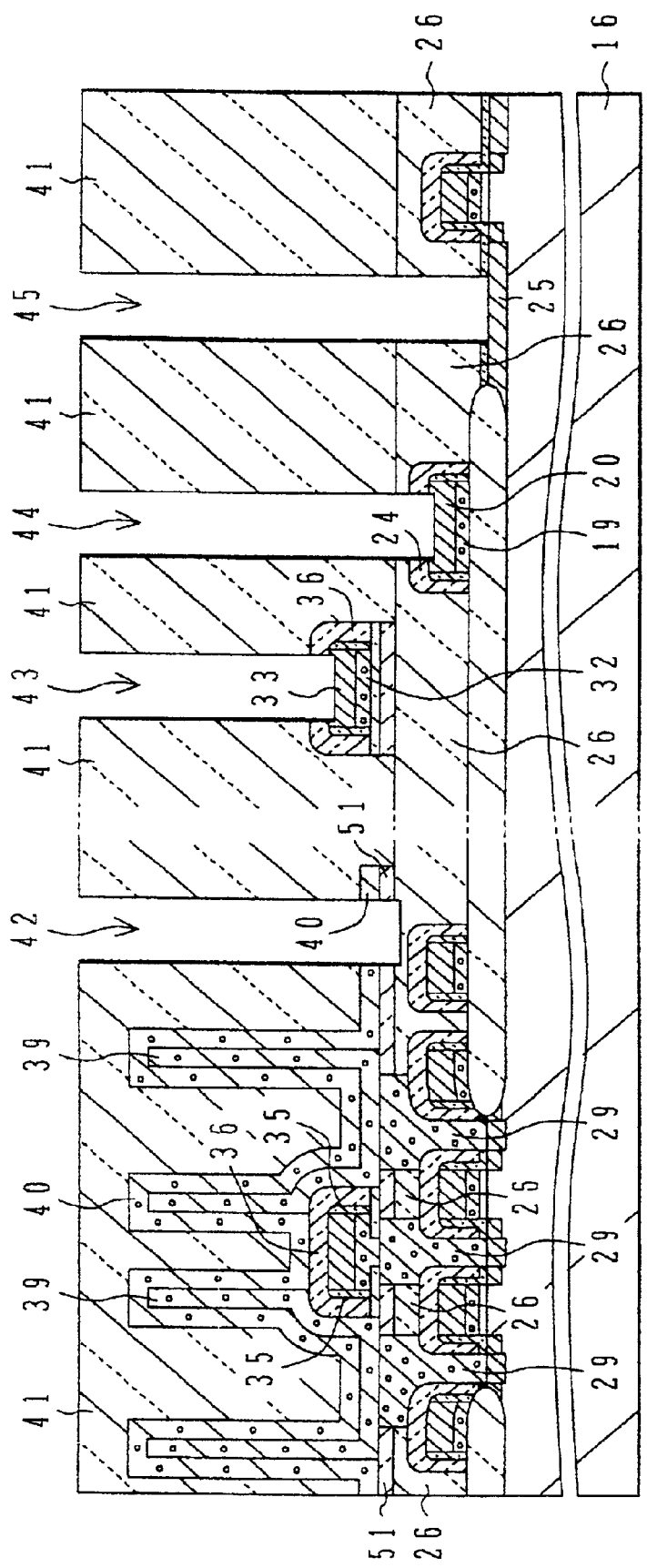
FIGS. 29 and 30 are schematic cross sectional views illustrating sixth DRAM manufacture processes according to another embodiment of the invention.

FIG. 29 shows the contact windows 42 to 45 formed by the embodiment method, after the opposing electrode 40 is formed and the BPSG film is planarized by the embodiment method of the first DRAM.

First, a first step of forming the contact windows 42 to 45 is performed to etch the BPSG film 41 at a sufficiently large etching ratio of the BPSG film 41 to the nitride film. This etching may use mixed gas of $C_4F_8$ and CO used for forming the nitride film SAC structure.

The first etching step continues until the surface of the lowermost diffusion region 25 is exposed. Although the opposing electrode 40 at the uppermost layer is etched and removed, the etching stops at this level and the lower BPSG film 26 is not etched because the nitride film 51 exists under the opposing electrode. The etching of the contact windows also stops at the nitride film regions 36 and 24.

Next, a second etching step etches the silicon nitride film at a large etching ratio of the silicon nitride film relative to etching of an oxide film such as BPSG, by using, for example, mixed gas of $CHF_3$ and $O_2$. With this process, the nitride film regions 36 and 24 at the bottoms of the contact windows 43 and 44 can be removed.

When the nitride film is etched, the nitride film 51 under the opposing electrode 40 is also etched. However, etching stops at the underlying BPSG film 26 so that the opposing electrode 40 and the lower wiring layer are not electrically shorted at the contact window 42. This contact window structure poses no practical problem because the first metal wiring layer formed in the contact window is electrically connected to the opposing electrode 40 at its side wall.

Figure 30:
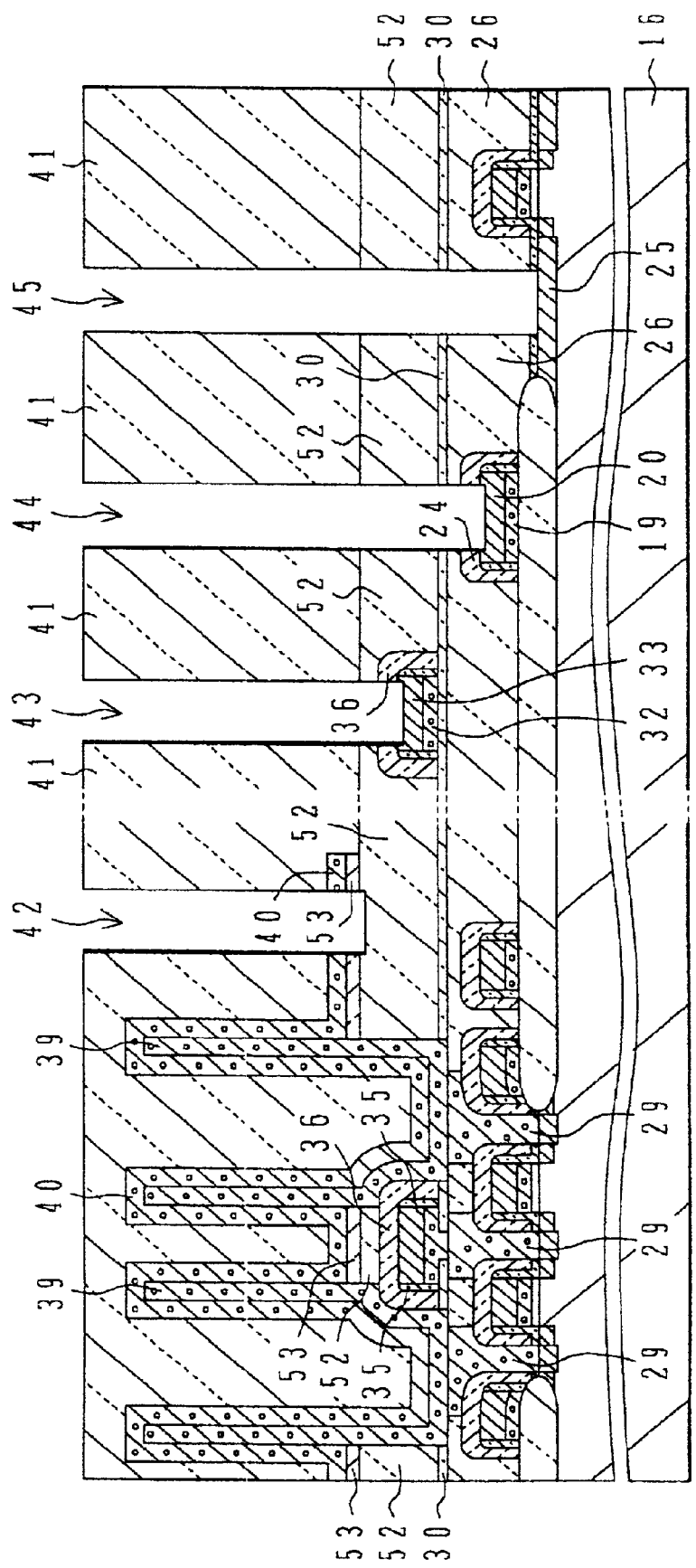

FIG. 30 shows the contact windows 42 to 45 formed by the embodiment method after the opposing electrode 40 is formed and the BPSG film is planarized by the embodiment method of the fifth DRAM as shown in FIG. 26, followed by the procceses as shown in FIGS. 10 to 13.

Since the DRAM shown in FIG. 30 has the nitride film 53 and BPSG film 52 under the opposing electrode 40 similar to the DRAM shown in FIG. 29, the above-described two etching steps can be used. Therefore, the contact windows 42 to 45 can be formed by a single photolithography process without a problem of short circuit to the underlying wiring layer.

With this embodiment, contact windows can be formed by a single photolithography process even for the structure having different contact window depths.

If the nitride film is not formed at the bottoms of the contact windows 43 and 44 and the first step can expose the surfaces of the wiring layer and the gate electrode, the second step of etching the nitride film is not necessary.

The method of forming a contact window of this embodiment is not limited to only to the above. For example, it is obvious that the same advantages can be obtained by providing a nitride film under a higher level wiring layer among a plurality of wiring layers and using the nitride film as the etching stopper.

However, if this embodiment itself is used without modification, in addition to the advantages specific to this embodiment, the advantages of the embodiments of the fourth and fifth DRAMs can be obtained.

7th DRAM

A method of manufacturing a seventh DRAM according to another embodiment of the invention will be described with reference to the schematic cross sectional view of FIG. 31.

In the embodiment of the first DRAM shown in FIG. 5A, the BPSG film 24 is planarized by reflow, etch-back, or CMP.

Figure 31:
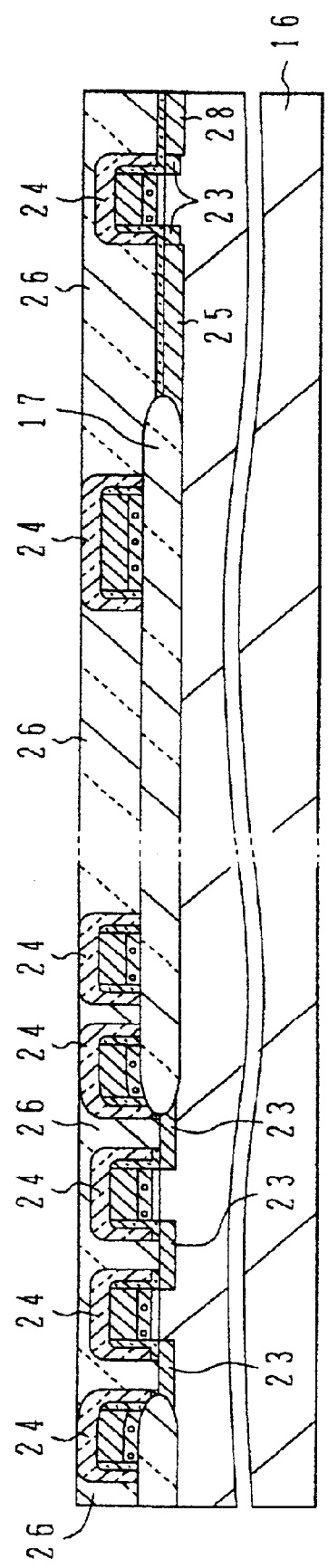
FIG. 31 is a schematic cross sectional view illustrating seventh DRAM manufacture processes according to another embodiment of the invention.

In this embodiment, as shown in FIG. 31, the BPSG film 26 formed on the gate electrode and word line is planarized by CMP by using the silicon nitride film region 24 on the field oxide layer 17 as its stopper layer.

A distance from the substrate to the silicon nitride film region 24 covering the polycide electrode of the gate electrode on the active region is different from that of the wiring layer on the field oxide film 17. In this embodiment, only the higher nitride film spacer is used as the stopper layer and the BPSG film 26 is left on the lower nitride film spacer.

For example, if silica containing material is used as abrasive material, the BPSG film can be abraded or polished at a high abrasion or polishing selection ratio of the BPSG film to the silicon nitride film.

This stopper layer not only planarizes the BPSG film 26 but also reduces a variation of film thickness.

If there is a variation of film thickness of the planarized BPSG film, the etching amount at the later contact window forming process is scattered. In order to obtain a reliable contact, it is necessary to completely remove the BPSG film in the contact window so that an over-etch amount of the BPSG film is required to be made large.

This over-etch reduces the thickness of the nitride film spacer of the nitride film spacer SAC structure, increasing a danger of a short circuit between the polycide electrode and upper wiring layer. Therefore, the stable film thickness of the BPSG film is particularly important.

In this embodiment, the nitride film region 24 itself which is necessary for the nitride spacer SAC structure is used without forming an additional stopper layer. The number of processes does not therefore increases.

After the BPSG film is planarized by CMP, another BPSG film may be formed to thicken the interlayer insulating film and reduce parasitic capacitance. As described with the embodiment of the fourth DRAM, the contact window forming process may be performed after the silicon nitride film is formed.

The thickness of the BPSG film 26 influences the parasitic capacitance of the bit line formed at the upper layer. If the variation of film thickness is reduced as in this embodiment, the variation of bit line capacitance can be reduced and the operation stability of DRAM can be improved.

Also in this embodiment, only the nitride spacer of the word line and wiring layer on the field insulating film is used as the stopper layer, and the nitride film spacer of the gate electrode on the active region is not used as the stopper layer.

Therefore, while the BPSG film is abraded by CMP, the nitride film spacer at the active region will not be abraded and the film thickness is not reduced.

With the nitride film SAC, a contact window is formed in a self alignment manner by using the nitride film spacer as a mask. The contact window is formed not over the field insulating film but over the diffusion region in the active region. Therefore, the nitride film spacer SAC process can use as a mask the nitride film whose thickness is not reduced during planarization by CMP.

In this embodiment, therefore, while planarization by CMP can be performed with high controllability by using the stopper layer, the polycide electrode and upper wiring layer can be avoided from being electrically shorted via the contact hole formed by the nitride film spacer SAC process.

With this embodiment, product yield and operation stability can be improved without increasing the number of processes.

8th DRAM

A method of manufacturing an eighth DRAM according to another embodiment of the invention will be described with reference to the schematic cross sectional view of FIG. 32.

In this embodiment, the techniques of the embodiment of the seventh DRAM is utilized for the process of planarizing the surface of the BPSG film on the conductive layer of bit lines.

In the embodiment of the first DRAM shown in FIG. 7, the BPSG film is planarized by reflow, etch-back, or CMP.

Figure 32:
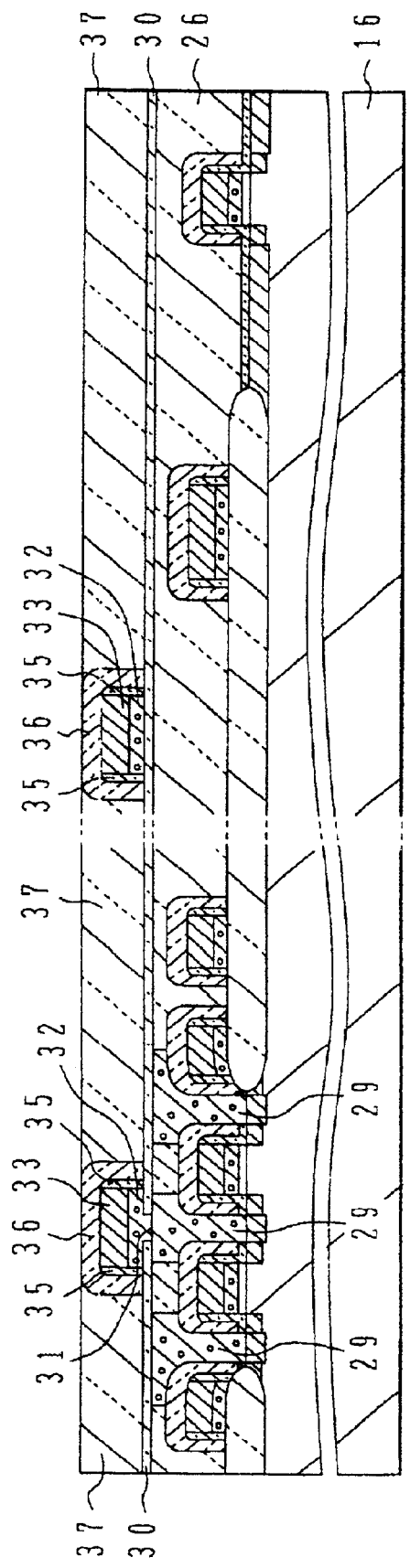
FIG. 32 is a schematic cross sectional view illustrating eighth DRAM manufacture processes according to another embodiment of the invention.

In this embodiment, as shown in FIG. 32, the BPSG film 37 formed on the bit line is planarized by CMP by using the silicon nitride film region 36 as its stopper layer.

For example, if silica containing material is used as abrasive material, the BPSG film can be abraded at a high abrasion selection ratio of the BPSG film to the silicon nitride film, similar to the embodiment of the seventh DRAM.

This stopper layer not only planarizes the BPSG film 37 but also reduces a variation of film thickness.

If there is a variation of film thickness of the planarized BPSG film, the etching amount at the later contact window forming process is scattered. Therefore, if the thickness of the nitride film spacer of the nitride film spacer SAC structure is reduced, a danger of a short circuit between the polycide electrode and upper wiring layer increases so that the stable film thickness of the BPSG film is particularly important, as in the case of the embodiment of the seventh DRAM.

Also in this embodiment, the nitride film region 36 itself which is necessary for the nitride spacer SAC structure is used without forming an additional stopper layer. The number of processes does not therefore increases.

Since the thickness of the BPSG film 37 influences the area of the storage electrode and hence the capacitance, after the CMP planarization another BPSG film may be formed to set a desired thickness and obtain a desired capacitance. Similar to the embodiment of the fifth DRAM, two layers of BPSG films with a nitride film being interposed may be used.

9th DRAM

A method of manufacturing a ninth DRAM according to another embodiment of the invention will be described with reference to the schematic cross sectional view of FIG. 33.

In the embodiment of the first DRAM shown in FIG. 5A, the n-type diffusion region 28 is formed in order to reduce junction leak.

Figure 33:
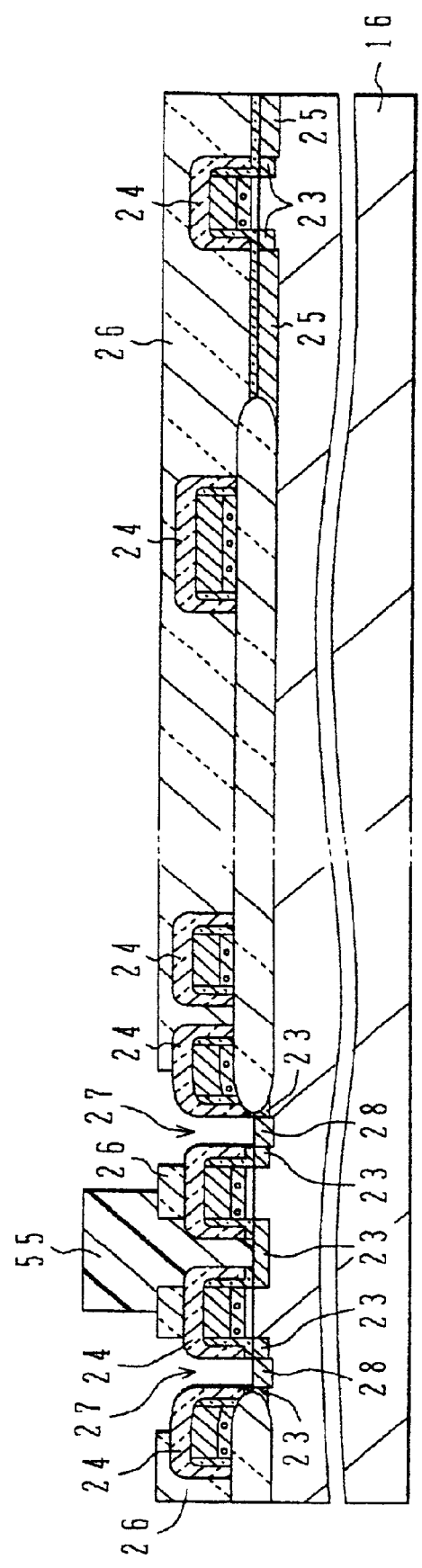
FIG. 33 is a schematic cross sectional view illustrating ninth DRAM manufacture processes according to another embodiment of the invention.
Figure 34A:
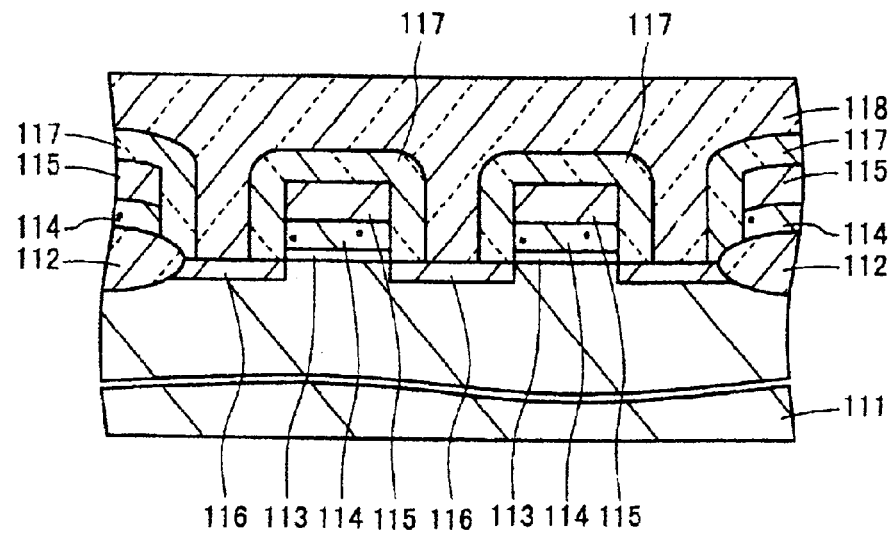
FIGS. 34A and 34B and FIGS. 35A and 35B are schematic cross sectional views illustrating nitride film spacer SAC.
Figure 34B:
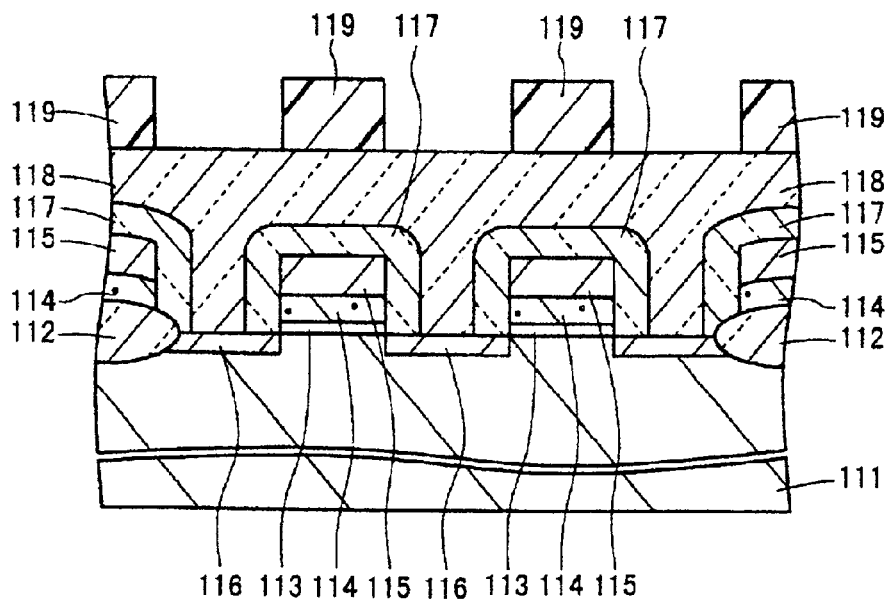

In this embodiment, as shown in FIG. 33 the n-type diffusion region 28 is formed only in the source/drain region on the side of a capacitor of the memory cell. After the source/drain region to which the bit line is connected is covered with a resist pattern 55, n-type impurity ions, phosphorous, are implanted at a dose of $3 \times 10^{13}$ cm$^{-2}$ into the silicon substrate exposed in the contact holes 27 by using the BPSG film 26 and nitride film regions 24 as a mask.

The n-type diffusion region 28 can suppress junction leak as described with the embodiment of the first DRAM. However, this ion implantation deepens the junction of the source/drain regions. Therefore, the short channel effects of transistors may be adversely affected or leak current between elements may increase.

The diffusion region which stores small electric charges on the capacitor side is required to reduce junction leak, whereas junction leak is not severe for the diffusion region connected to the bit line.

In this embodiment, therefore, ions are implanted only into the diffusion region connected to the capacitor so that one of the source/drain regions of a MOS transistor can be made to have a shallow junction and the short channel effects of transistors and leak current between elements can be prevented from being adversely affected.

The present invention has been described in connection with the above embodiments. The invention is not limited only to the above embodiments. It is obvious that the invention is applicable to processes having the same technical concept as the above-described processes.

In the above description, WSi is used as the polycide electrode. Other silicide materials such as MoSi and TiSi may also be used. In addition to silicide, metals and metal compounds may be used, including tungsten (W), molybdenum (Mo), titanium nitride (TiN), and titanium tungsten (TiW). Since an oxide film is difficult to be formed on metal or metal compound by thermal oxidation, an oxide film may be formed by CVD or the like.

In the above description, a silicon oxide film is used as the insulating film formed between the gate electrode and nitride film. Other insulating films may also be used if they can relax strains in the silicon nitride film. If a silicon oxynitride (SiON) film is used, it can be used also as an antireflection film on the silicide film so that the number of processes can be effectively shortened.

Although BPSG is used as an interlayer insulating film, other materials such as phosphosilicate glass (PSG) and a silicon oxide film may also be used.

Although isotropic etching of wet etching and anisotropic etching of RIE are used as the etching method, other etching such as isotropic plasma etching and ECR etching may be selectively used depending upon processes.

Although a phosphorous doped silicon film is used as the plug formed in the contact window, a silicon film doped with p-type impurities such as boron may be used if the plug is formed on the p-type diffusion region or p-type silicon layer. The material of the plug is not limited only to the silicon film, but metals and metal compounds such as W and TiW or metal silicide may also be used.

Although the oxidized nitride film is used as the capacitor insulating film, high dielectric constant films and ferroelectric films such as a tantalum oxide ($Ta_2O_5$) film and a PZT film may also be used. In this case, metal is used as the storage electrode and/or the opposing electrode so that a capacitance reduction by natural oxidation of the electrode can be prevented and reaction between the capacitor insulating film and silicon film can be avoided.

As the silicon film, polysilicon or amorphous silicon may be used. Impurity doping may be performed at the same time when the film is grown, or diffusion or ion implantation may be performed after the film is grown.

In the above embodiments, although a method of forming a cylinder type capacitor is used, obviously the invention is applicable to other capacitor structures such as a stack type and a fin type.

Although the invention has been described along the preferred embodiments, it is not limited thereto. It will be apparent that various modifications, alterations, combinations or the like can be made.

We claim:

1. A semiconductor device comprising:
   a semiconductor substrata having an uppermost insulating film;
   lamination of a first conductive film of metal or metal silicide, a first insulating film, and a second insulating film made of silicon nitride laminated in this order from a lower side, the lamination being formed on or above the uppermost insulating film, and having a same pattern defined with a pair of side walls;
   a pair of third insulating films formed on the pair of side walls of the lamination covering at least the first conductive film, the third insulating film being made of a same material as the first insulating film, and having a thickness smaller than that of the first insulating film;
   a pair of fourth insulating films formed on the pair of side walls of the lamination through said third insulating films, to be contiguous to said second insulating film, the second and the fourth insulating films collectively coveting the first conductive film;

an interlevel insulating layer formed on or above said semiconductor substrate, covering said second and fourth insulating films;

an aperture formed through said interlevel insulating layer, at least partially exposing one of said fourth insulating films; and a second conductive film filling the aperture.

2. A semiconductor device according to claim 1, wherein said first insulating film and said pair of third insulating films cover the side wall and upper surface of said fist conductive film.

3. A semiconductor device according to claim 1, wherein said third insulating film extends under a bottom end of said fourth insulating film positioned on the side wall of said first conductive film.

4. A semiconductor device according to claim 1, wherein said first conductive film is a gate electrode of a MIS transistor.

5. A semiconductor device according to claim 1, wherein said third insulating film is made of a silicon oxide film.

6. A semiconductor device according to claim 1, wherein said interlevel insulating layer has etching characteristics different from a silicon nitride film and is formed on said second insulating film made of a silicon nitride.

7. A semiconductor device according to claim 6, wherein the surface of said interlevel insulating layer is generally parallel to said semiconductor substrate.

8. A semiconductor device according to claim 6, further comprising:

a fifth insulating film formed on the interlevel insulating layer and defining a contact area on said second conductive film.

9. A semiconductor device according to claim 8, further comprising:

an upper conductive pattern formed on said fifth insulating film and on said second conductive film;

a sixth insulating film made of an insulating material other than silicon nitride, and formed to cover at least a side wall of said upper conductive pattern; and a seventh insulating film made of silicon nitride and formed to continuously cover said upper conductive pattern and said sixth insulating film.

10. A semiconductor device according to claim 9, further comprising:

another contact area formed in said interlevel insulating layer on an opposite side of said first conductive film to said contact area, having a bottom portion at least partially defined by said fourth insulating film; and another conductive film filling said another contact area;

wherein said fifth insulating film further defines another contact area on said another conductive; film.

11. A semiconductor device according to claim 10, further comprising a storage capacitor formed on said another conductive film.

12. A semiconductor device according to claim 11, wherein said storage capacitor is formed to at least partially cover said seventh insulating film.

13. A semiconductor device according to claim 9, further comprising:

an eighth insulating film made of silicon nitride formed between said interlevel insulating layer and fifth insulating film, and cooperatively defining said aperture with said interlevel insulating layer.

14. A semiconductor device according to claim 11, further comprising:

a field insulating film formed on a surface of said semiconductor substrate, and having a surface at a higher level than said insulating surface of said substrate;

wiring patterns formed on said field insulating film and on said fifth insulating film; and silicon nitride layers covering said wiring patterns.

15. A semiconductor device according to claim 14, further comprising:

an interlayer insulating layer covering said fifth insulating layer, said storage capacitor, and said silicon nitride layer covering the wiring pattern on said fifth insulating film;

connection holes formed through said interlayer insulating layer and reaching said wiring patterns; and upper wiring patterns.

16. A semiconductor device according to claim 15, wherein said storage capacitor includes a storage electrode connected to said another conductive film, a dielectric film formed on said storage electrode and on said fifth insulating film, and an opposing electrode farmed on said dielectric film and having an extension on said fifth insulating film, one of said connection holes penetrates through said opposing electrode at said extension, and one of said upper wiring patterns makes electrical contact with said opposing electrode at its side wall.

17. A semiconductor device according to claim 1, wherein said first conductive film forms a bit line of a dynamic random access memory.

18. A semiconductor device comprising:

a semiconductor substrate having an uppermost insulating film;

lamination of a first conductive film made of metal or metal suicide, a first insulating film, and a second insulating film made of silicon nitride laminated in this order from a lower side, the lamination being formed on or above the uppermost insulating film, and having a same pattern defined with a pair of side walls;

a pair of third insulating formed on the pair of side walls of the lamination covering at least the first conductive film, the third insulating film having a thickness smaller than that of the first insulating film, the first and third insulating films being made of different materials except silicon nitride;

a pair of fourth insulating films formed on the pair of side walls of the lamination through said third insulating films, to be contiguous to said second insulating film, the second and the fourth insulating film collectively covering the first conductive film;

an interlevel insulating layer formed on or above said semiconductor substrate, covering said second and fourth insulating films;

an aperture formed through said interlevel insulating layer, at least partially exposing one of said fourth insulating films; and a second conductive film filling the aperture.

19. A semiconductor device according to claim 18, wherein said third insulating film extends under a bottom end of said fourth insulating film positioned on the side wall of said lamination.

20. A semiconductor device according to claim 18, wherein said first conductive film is a gate electrode of a MIS transistor.

21. A semiconductor device according to claim 18, wherein said third insulating film is made of a silicon oxide film.

22. A semiconductor device according to claim 18, wherein said interlevel insulating layer has etching characteristics different from a silicon nitride film and is formed on said second insulating film made of a silicon nitride.

23. A semiconductor device according to claim 22, further comprising:
a fifth insulating film formed on the interlevel insulating layer and defining a contact area on said second conductive film.

24. A semiconductor device according to claim 23, further comprising:
an upper conductive pattern formed on said fifth insulating film and on said second conductive film;
a sixth insulating film made of an insulating material other than silicon nitride, and formed to cover at least a side wall of said upper conductive pattern; and
a seventh insulating film made of silicon nitride and formed to continuously cover said upper conductive pattern and said sixth insulating film.

25. A semiconductor device according to claim 24, further comprising:
another contact area formed in said interlevel insulating layer on an opposite side of said first conductive film to said contact area, having a bottom portion at least partially defined by said fourth insulating film; and
another conductive film filling said another contact area;
wherein said fifth insulating film further defines another contact area on said another conductive film.

26. A semiconductor device according to claim 25, further comprising a storage capacitor formed on said another conductive film.

27. A semiconductor device according to claim 26, wherein said storage capacitor is formed to at least partially cover said seventh insulating film.

28. A semiconductor device according to claim 27, further comprising:
an eighth insulating film made of silicon nitride, formed between said fourth and fifth insulating films, and cooperatively defining said aperture with said fourth insulating film.

29. A semiconductor device according to claim 28, further comprising:
a field insulating film formed on a surface of said semiconductor substrate, and having a surface at a higher level than said insulating surface of said substrate;
wiring patterns formed on said field insulating film and on said fifth insulating film; and
silicon nitride layers covering said wiring patterns.

30. A semiconductor device according to claim 29, further comprising:
an interlayer insulating layer covering said fifth insulating film, said storage capacitor, and said silicon nitride layer covering the wiring pattern on said fifth insulating film;
connection holes formed through said interlayer insulating layer and reaching said wiring patterns; and
upper wiring patterns.

31. A semiconductor device according to claim 30, wherein said storage capacitor includes a storage electrode connected to said another conductive film, a dielectric film formed on said storage electrode and on said fifth insulating film, and an opposing electrode formed on said dielectric film having an extension on said fifth insulating film one of said connection holes penetrates through said opposing electrode at said extension, and one of said upper wiring patterns makes electrical contact with said opposing electrode at its side wall.

32. A semiconductor device according to claim 18, wherein said first conductive film forms a bit line of a dynamic random access memory.

33. A semiconductor device according to claim 18, wherein the first insulating film is made of silicon oxynitride.

34. A semiconductor device according to claim 18, wherein the surface of said interlevel insulating layer is generally parallel to said semiconductor substrate.

\* \* \* \* \*